US009385235B2

(12) United States Patent
Chen

(10) Patent No.: US 9,385,235 B2
(45) Date of Patent: Jul. 5, 2016

(54) FIN FIELD EFFECT TRANSISTOR (FINFET) DEVICE AND METHOD FOR FORMING THE SAME

(71) Applicant: Taiwan Semiconductor Manufacturing Co., Ltd, Hsin-Chu (TW)

(72) Inventor: Huang-Kui Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/291,899

(22) Filed: May 30, 2014

(65) Prior Publication Data

US 2015/0349125 A1 Dec. 3, 2015

(51) Int. Cl.
| | |
|---|---|
| H01L 29/02 | (2006.01) |
| H01L 29/78 | (2006.01) |
| H01L 29/423 | (2006.01) |
| H01L 29/417 | (2006.01) |
| H01L 29/06 | (2006.01) |
| H01L 29/10 | (2006.01) |
| H01L 29/49 | (2006.01) |
| H01L 21/28 | (2006.01) |
| H01L 21/3213 | (2006.01) |
| H01L 29/66 | (2006.01) |

(52) U.S. Cl.
CPC ...... *H01L 29/7851* (2013.01); *H01L 21/28035* (2013.01); *H01L 21/32133* (2013.01); *H01L 21/32139* (2013.01); *H01L 29/0653* (2013.01); *H01L 29/1037* (2013.01); *H01L 29/41791* (2013.01); *H01L 29/4238* (2013.01); *H01L 29/42376* (2013.01); *H01L 29/4916* (2013.01); *H01L 29/66795* (2013.01)

(58) Field of Classification Search
CPC ............. H01L 29/42384; H01L 29/66545; H01L 29/66795; H01L 29/66462; H01L 29/785; H01L 29/7847; H01L 29/402; H01L 29/42316

USPC .................. 257/347, 365, 368, 401
See application file for complete search history.

(56) References Cited

U.S. PATENT DOCUMENTS

| | | | | |
|---|---|---|---|---|
| 8,436,404 | B2 | 5/2013 | Bohr et al. | |
| 8,470,714 | B1 * | 6/2013 | Tsai | H01L 29/66795 438/699 |
| 8,853,015 | B1 * | 10/2014 | Kuo | H01L 21/76224 257/347 |
| 2004/0113171 | A1 * | 6/2004 | Chiu | H01L 29/42384 257/119 |
| 2009/0101978 | A1 * | 4/2009 | Anderson | H01L 29/785 257/365 |
| 2009/0256207 | A1 * | 10/2009 | Chen | H01L 21/76283 257/365 |
| 2009/0309136 | A1 * | 12/2009 | Chen | H01L 21/823412 257/204 |
| 2013/0200468 | A1 * | 8/2013 | Cai | H01L 29/66545 257/401 |
| 2013/0214332 | A1 * | 8/2013 | Wu | B82Y 10/00 257/253 |
| 2013/0267073 | A1 * | 10/2013 | Yin | H01L 21/823431 438/283 |
| 2014/0054714 | A1 * | 2/2014 | Baars | H01L 29/66545 257/368 |
| 2014/0097473 | A1 * | 4/2014 | Ikura | H01L 29/402 257/201 |
| 2014/0367785 | A1 * | 12/2014 | Shieh | H01L 29/06 257/368 |
| 2015/0001593 | A1 * | 1/2015 | Kuo | H01L 29/66803 257/288 |

(Continued)

*Primary Examiner* — Michael Lebentritt
(74) *Attorney, Agent, or Firm* — Birch, Stewart, Kolasch & Birch, LLP

(57) ABSTRACT

A fin field effect transistor (FinFET) device structure and method for forming FinFET device structure are provided. The FinFET structure includes a substrate and a fin structure extending above the substrate. The FinFET structure also includes a gate electrode formed over the fin structure, and the gate electrode has a grid-like pattern when seen from a top-view.

19 Claims, 40 Drawing Sheets

(56) References Cited

U.S. PATENT DOCUMENTS

2015/0035069 A1* 2/2015 Hung .................. H01L 27/1211
　　　　　　　　　　　　　　　　　　　257/369

2015/0052491 A1* 2/2015 Tsao ....................... G03F 1/144
　　　　　　　　　　　　　　　　　　　716/53

* cited by examiner

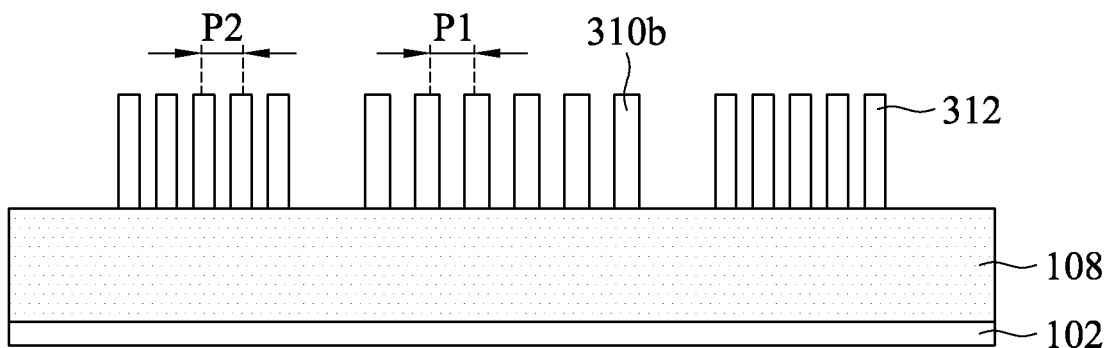
FIG. 3C″
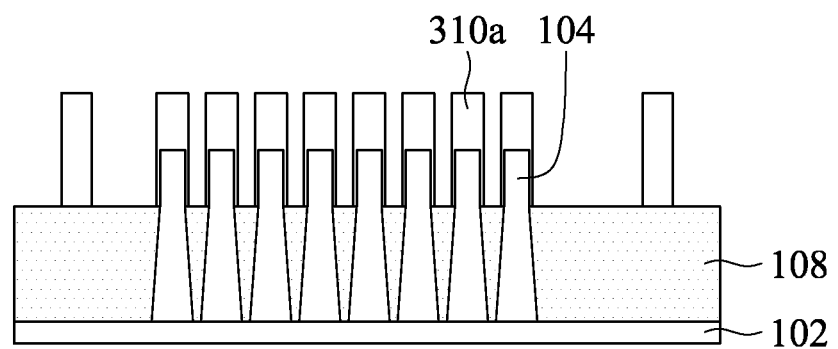
FIG. 3C‴

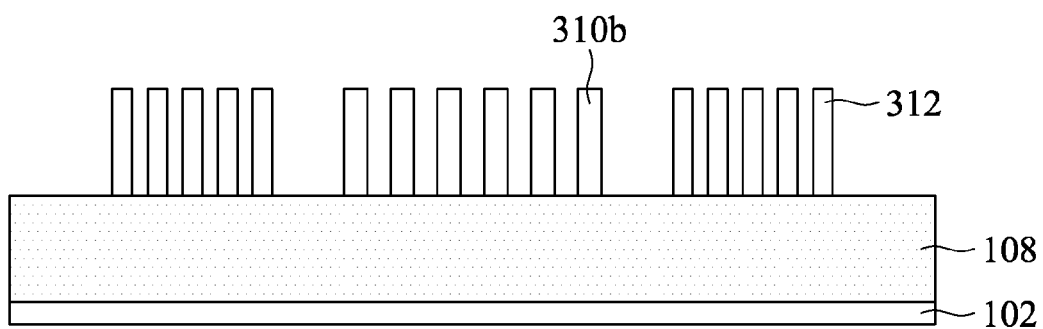
FIG. 4F"

FIN FIELD EFFECT TRANSISTOR (FINFET) DEVICE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A', 3B', 3C', 3C'', 3C''', 3D', 3D'', 3D''', 3E', 3E'', 3E''', 3F', 3F'', 3F''', 3G', 3G'', 3G''', 3H', 3H'' and 3H''' are cross-sectional representations of FIGS. 3A-3H.

FIG. 4A', 4B', 4C', 4D', 4E', 4F' and 4F'' are cross-sectional representations of FIGS. 4A-4F.

FIG. 5A', 5B', 5C', 5D', 5E' and 5F' are cross-sectional representations of FIGS. 5A-5F.

DETAILED DESCRIPTION

Figure 1A:
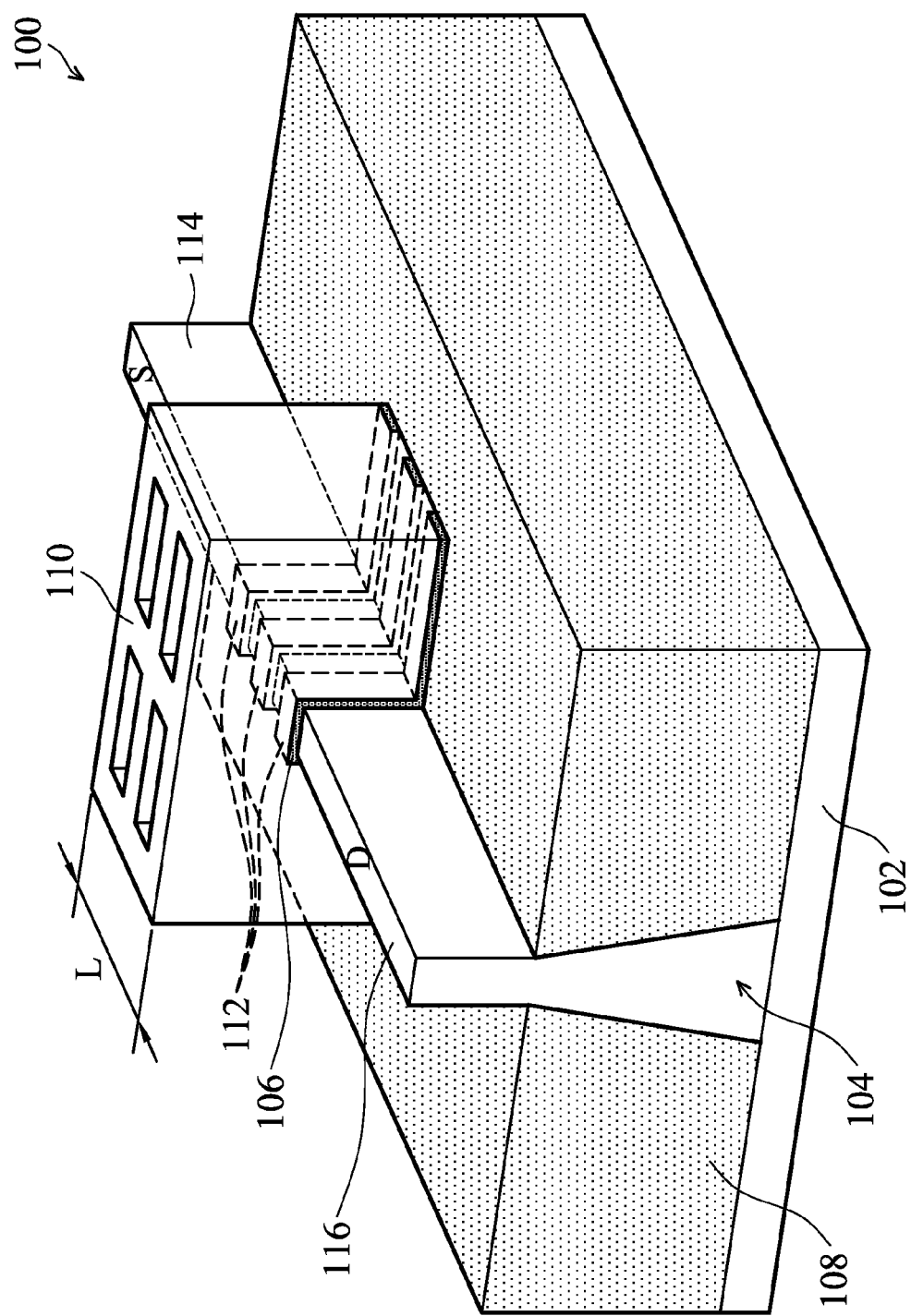
FIG. 1A shows a perspective representation of a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1A shows a perspective representation of a fin field effect transistor (FinFET) device structure 100, in accordance with some embodiments of the disclosure.

FinFET device structure 100 includes a substrate 102. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

FinFET device structure 100 also includes one or more fin structures 104 (e.g., Si fins) that extend from the substrate 102. Fin structures 104 may optionally include germanium. Fin structures 104 may be formed by using suitable processes such as photolithography and etching processes. In some embodiments, fin structures 104 are etched from substrate 102 using dry etch or plasma processes.

Isolation structure 108, such as a shallow trench isolation (STI) structure, is formed to surround fin structures 104. In some embodiments, a lower portion of fin structure 104 is surrounded by isolation structure 108, and an upper portion of fin structure 104 protrudes from isolation structure 108, as shown in FIG. 1A. In other words, a portion of fin structure 104 is embedded in isolation structure 108. Isolation structure 108 prevents electrical interference or crosstalk.

FinFET device structure 100 further includes a gate stack structure including a gate electrode 110 and a gate dielectric layer 106. The gate stack structure is formed over a central portion of fin structure 104. In some other embodiments, multiple gate stack structures are formed over the fin structure 104. Numerous other layers may also be present in the gate structures, for example, capping layers, interface layers, spacer elements, and/or other suitable features.

Gate dielectric layer 106 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

Gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

Fin structure 104 includes a channel region 112 surrounded or wrapped by gate electrode 110 and gate dielectric layer 106. Gate electrode 110 has a length L. In some embodiments, length L is in a range from about 36 nm to about 360 nm.

Fin structure 104 may be doped to provide a suitable channel for an N-type FinFET (NMOS device) or P-type FinFET (PMOS device). Fin structure 104 may be doped using a suitable process, such as an ion implantation process, diffusion process, annealing process, other applicable processes, or combinations thereof. Fin structures 104 includes a source region 114 and a drain region 116 between the channel region 112. FinFET device 100 may be a device included in a microprocessor, memory cell (e.g., Static Random-Access Memory (SRAM)), and/or other integrated circuits.

Figure 1B:
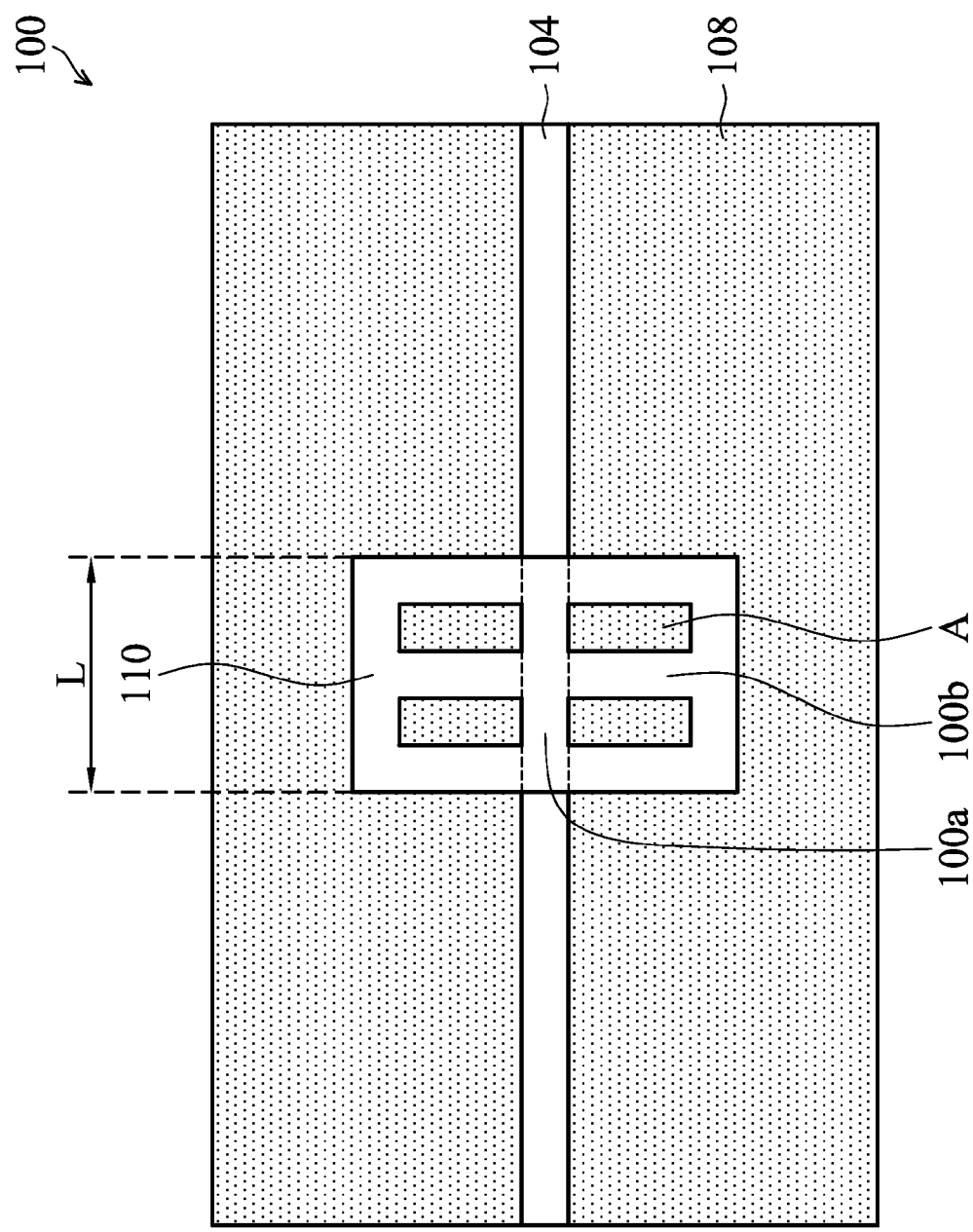
FIG. 1B shows a top-view of a fin field effect transistor (FinFET) device structure, in accordance with some embodiments of the disclosure.

FIG. 1B shows a top-view of a fin field effect transistor (FinFET) device structure 100, in accordance with some embodiments of the disclosure. FinFET device structure 100 includes a fin structure 104 and a gate electrode 110. Gate electrode 110 has a grid-like pattern when seen from a top-view. Gate electrode 110 has a number of first portions 110a and a number of second portions 110b, and first portions 110a are perpendicular to second portions 110b. First portions 110a are parallel to fin structure 104. Second portions 110b traverse over fin structure 104. A number of regions A are enclosed by the first portions 110a and the second portions 110b. Isolation structure 108 is exposed by regions A. Regions A are in the shape of a circle, rectangle, ellipse, square, or polygon when seen from a top-view. In some embodiments, regions A have a rectangular shape, as shown in FIG. 1B.

Figure 2A:
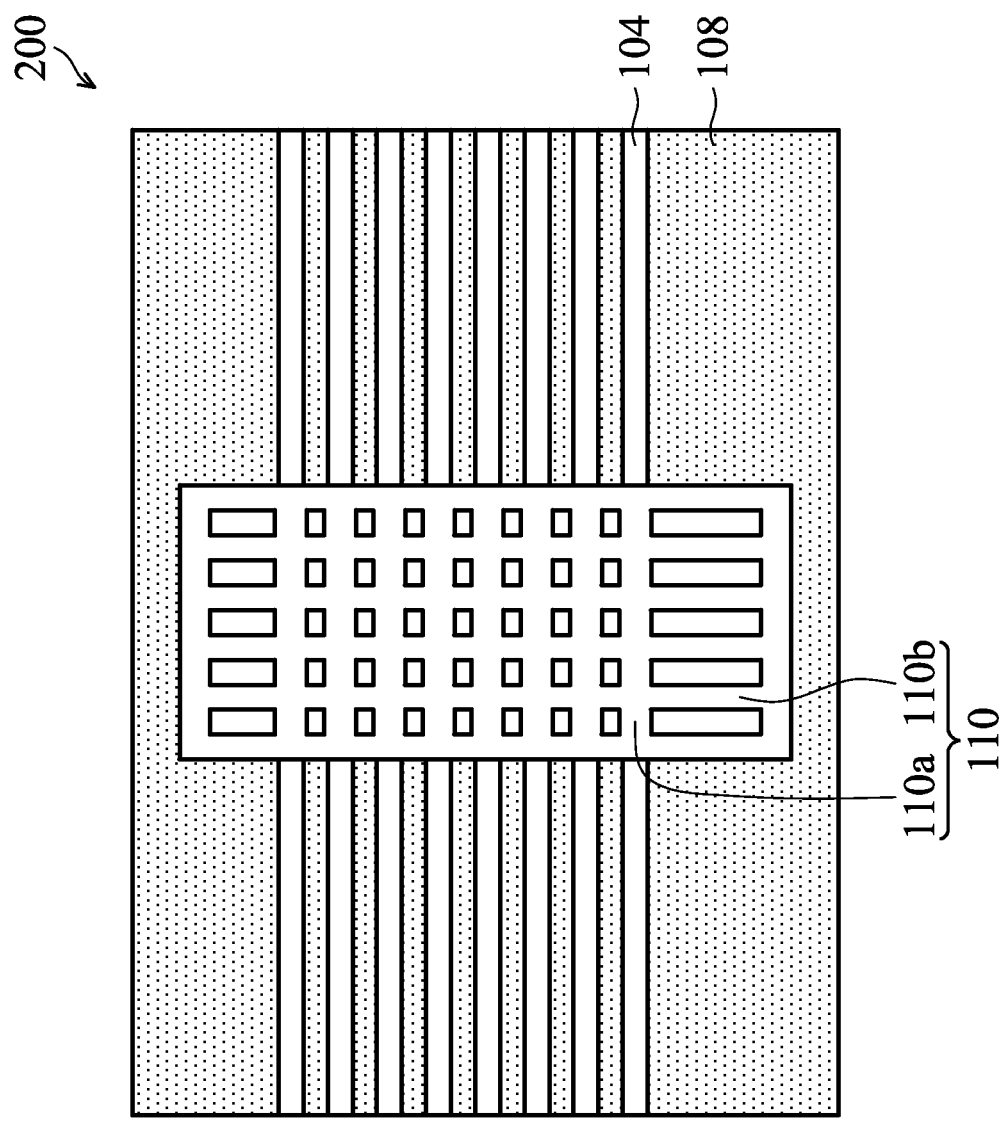
FIG. 2A shows a top-view of a fin field effect transistor (FinFET) device structure, in accordance with some embodiments of the disclosure.

FIG. 2A shows a top-view of a fin field effect transistor (FinFET) device structure 200, in accordance with some embodiments of the disclosure. A number of fin structures 104 are substantially parallel to each other. Gate electrode 110 is formed over fin structures 104. Like FIG. 1B, gate electrode 110 has a grid-like pattern when seen from a top-view. Gate electrode 110 has a number of first portions 110a and a number of second portions 110b, and first portions 110a are perpendicular to second portions 110b.

Figure 2B:
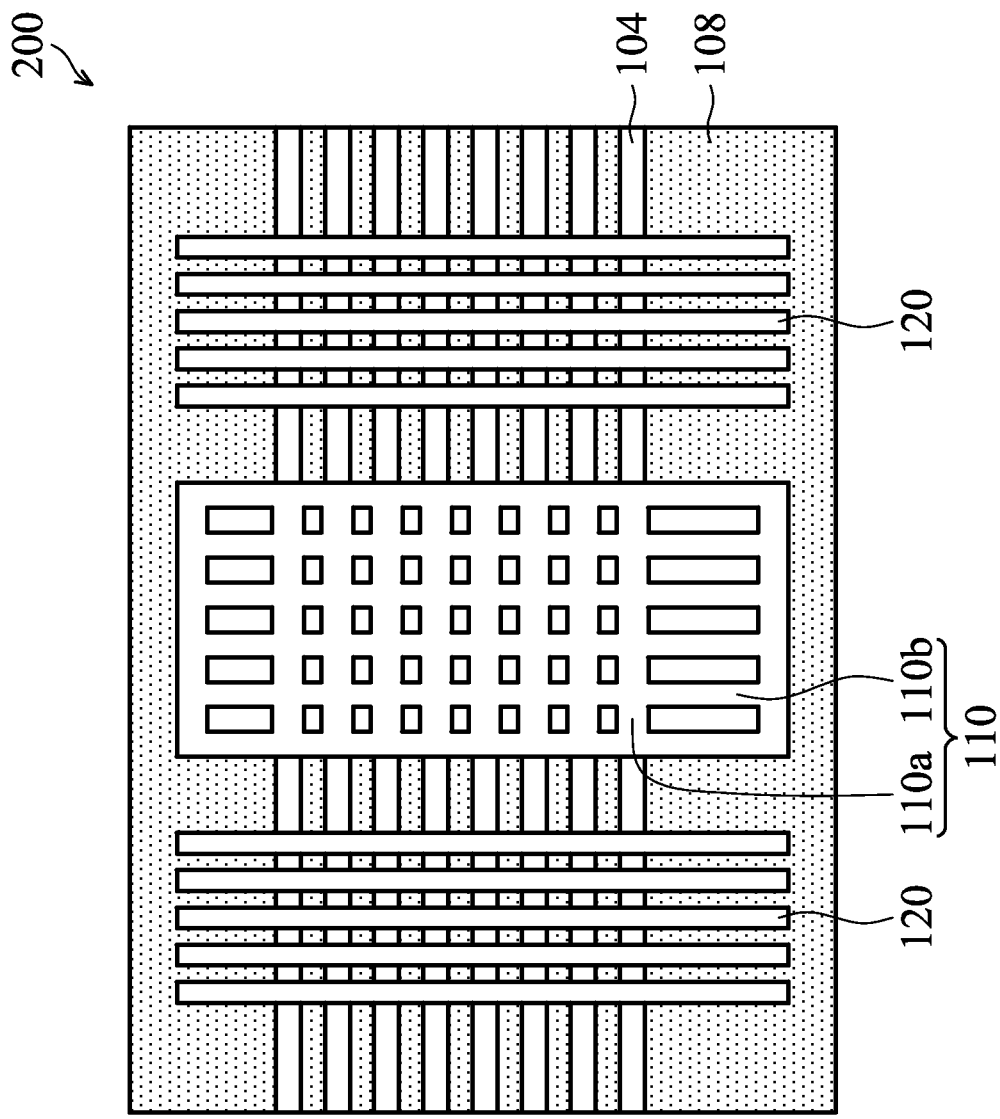
FIG. 2B shows a top-view of a fin field effect transistor (FinFET) device structure, in accordance with some embodiments of the disclosure.

FIG. 2B shows a top-view of a fin field effect transistor (FinFET) device structure 200, in accordance with some embodiments of the disclosure. The difference between FIG. 2A and FIG. 2B is that additional dummy gate electrodes 120 are formed adjacent to gate electrodes 110 in FIG. 2B. Dummy gate electrodes 120 are used to reduce a loading effect when performing subsequent etching processes. The loading effect will be described later. As shown in FIG. 2B, dummy gate electrodes 120 may also be parallel to each other and substantially perpendicular to the fin structures 104.

FIGS. 3A-3H show top-view representations of various stages of forming a fin field effect transistor (FinFET) device structure 200, in accordance with some embodiments of the disclosure. FIGS. 3A-3H shows a gate-last process to form high-K/metal gate (HK/MG) structure over fin structures 104.

Figure 3A:
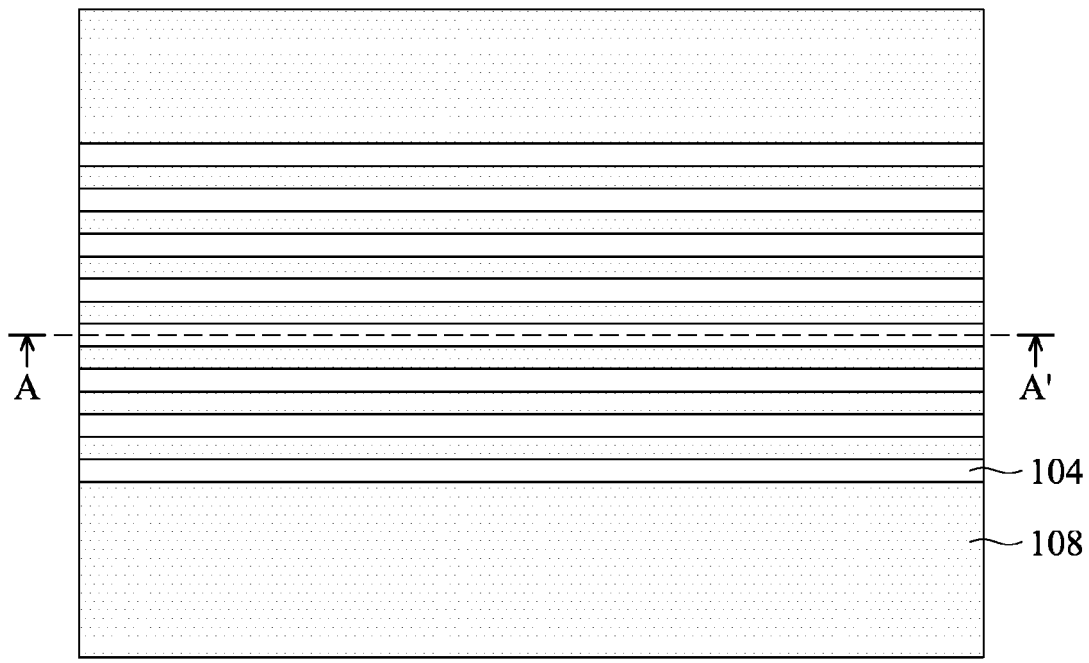
FIGS. 3A-3H show top-view representations of various stages of forming a fin field effect transistor (FinFET) device structure, in accordance with some embodiments of the disclosure.
Figure 3A:
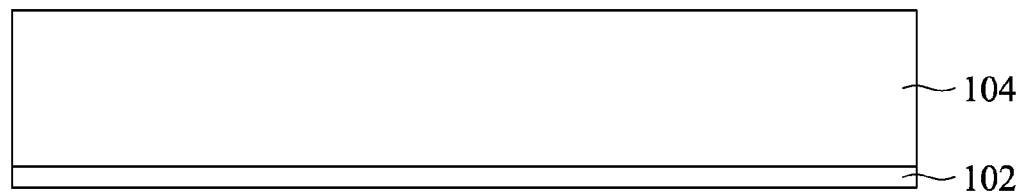

FIG. 3A shows a top-view representation, and FIG. 3A' is a cross-sectional representation taken along line AA' of FIG. 3A. Fin structures 104 are formed over substrate 102. In some embodiments, the substrate 102 is etched to form fin structure 104 by first depositing and patterning a hard mask layer (not shown) on substrate 102. The hard mask layer forms a pattern covering a portion of substrate 102. Afterwards, substrate 102 is etched to form trenches between the regions covered by the hard mask layer. As a result, fin structures 104 are formed between the trenches.

Afterwards, a dielectric material (e.g., silicon oxide) is deposited into the trenches and covers fin structures 104. The dielectric material is planarized down to the top surfaces of fin structures 104, and then the dielectric material is etched to a level below the top surfaces of fin structures 104. As a result, an upper portion of fin structures 104 protrudes above isolation structure 108, and a lower portion of fin structures 104 is surrounded and covered by isolation structure 108.

Alternatively, in some other embodiments, isolation structure 108 is firstly formed over substrate 102. Trenches between isolation structure 108 are formed to expose substrate 102. A semiconductor material, such as silicon, silicon germanium, or other applicable materials, is then grown in the trenches to form fin structures 104 by using, for example, an epitaxial process. After fin structure 104 is grown to the predetermined height, isolation structure 108 is etched down to a level below the top surface of fin structures 104. As a result, a portion of fin structures 104 protrudes above isolation structure 108.

Figure 3B:
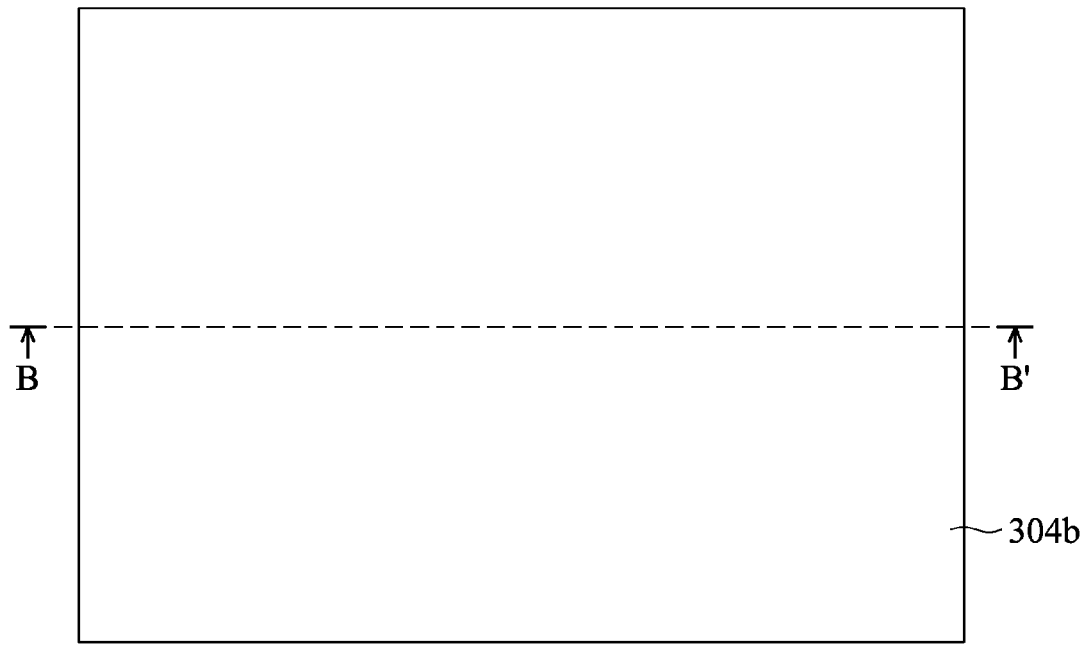
Figure 3B:
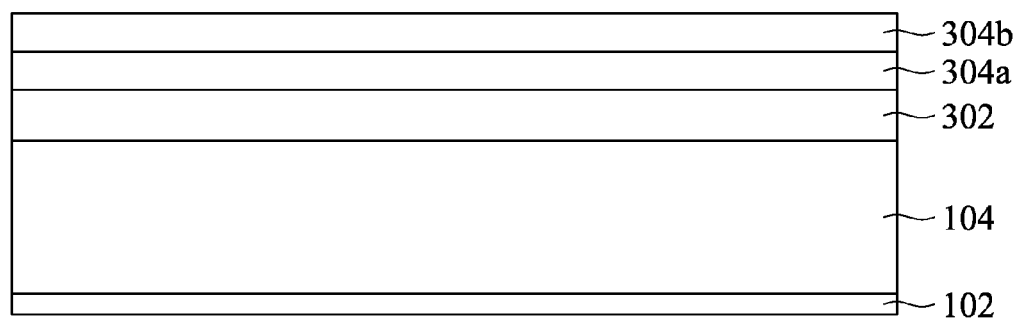

After fin structures 104 are formed, a polysilicon layer 302, photoresist layers 304a, 304b are sequentially formed on fin structures 104 as shown in FIG. 3B, in accordance with some embodiments of the disclosure. FIG. 3B' is a cross-sectional representation taken along line BB' of FIG. 3B. Afterwards, photoresist layer 304b is patterned to form patterned photoresist layer 304b.

In some embodiments, photoresist layer 304a is made of silicon oxide, silicon nitride, silicon oxynitride, or other applicable materials. In some embodiments, photoresist layer 304b is made of silicon oxide, silicon nitride, silicon oxynitride, or other applicable materials. In some other embodiments, photoresist layer 304b is replaced by a bottom anti-reflective coating (BARC) layer. The BARC layer is used to enhance a photolithography process for patterning photoresist layer 304a. Photoresist layers 304a, 304b are formed by a patterning process. The patterning process includes a photolithography process and an etching process. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process.

Figure 3C:
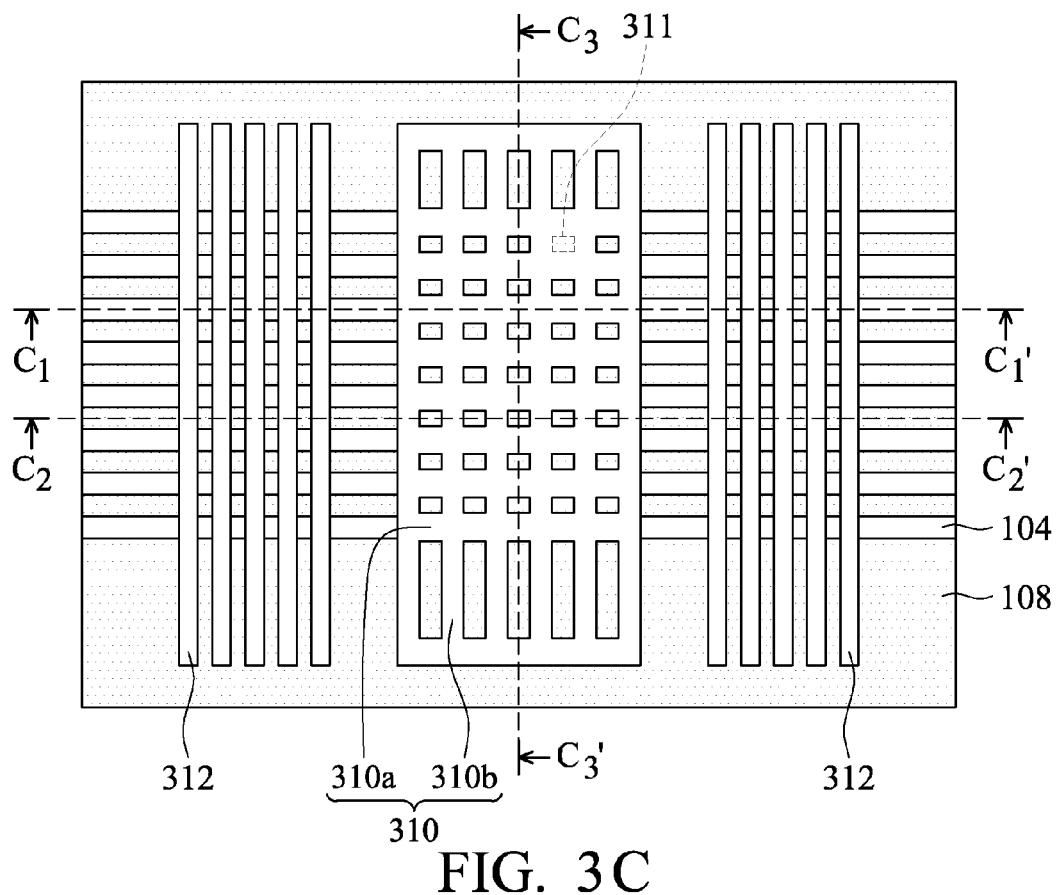
Figure 3C:
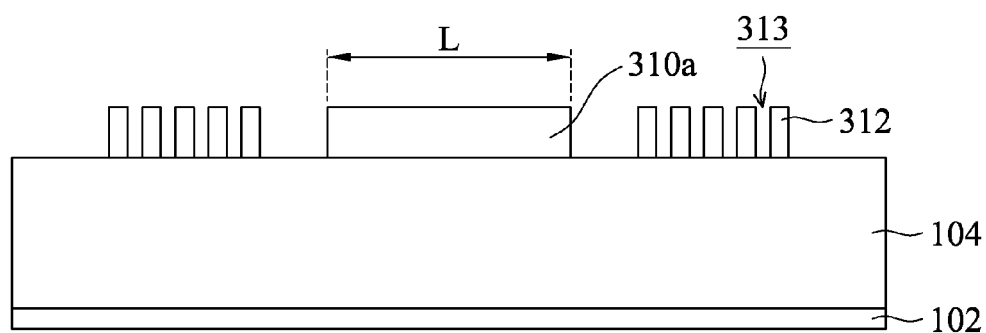

After patterned photoresist layer 304b are formed, a portion of polysilicon layer 302 is removed by using patterned photoresist layer 304b as a mask as shown in FIG. 3C, in accordance with some embodiments of the disclosure. As a result, a temporal gate electrode 310 and a number of intermediate dummy gate electrodes 312 are formed.

Note that temporal gate electrode 310 has a grid-like pattern when seen from a top-view. Temporal gate electrode 310 has a number of first portions 310a and a number of second portions 310b. First portions 310a are parallel to fin structures 104, and second portions 310b are perpendicular to fin structures 104. More specifically, the recesses 311 are enclosed by first portions 310a and second portions 310b, and the recesses 311 have a circle, rectangle, ellipse, square, or polygon when seen from a top view.

FIG. 3C' is a cross-sectional representation taken along line $C_1C_1'$ of FIG. 3C. In the middle portion of FIG. 3C', first portions 310a of temporal gate electrode 310 are formed over fin structure 104. In the side portion of FIG. 3C', a number of intermediate dummy gate electrodes 312 are formed on fin structures 104, and recesses 313 are formed between adjacent intermediate dummy gate electrodes 312. In some embodiments, first portions 310a of temporal gate electrode 310 have a length L.

FIG. 3C" is a cross-sectional representation taken along line $C_2C_2'$ of FIG. 3C. Second portions 310b of temporal gate electrode 310 are formed on isolation structure 108. Second portions 310b of temporal gate electrode 310 are spaced apart from each other. In some embodiments, a pitch $P_1$ between two adjacent second portions 310b of temporal gate electrode 310 is in a range from about 60 nm to about 120 nm. In some embodiments, a pitch $P_2$ between two adjacent dummy gate electrodes 312 is in a range from about 60 nm to about 120 nm. In some embodiments, the pitch $P_1$ is equal to the pitch $P_2$.

FIG. 3C''' is a cross-sectional representation taken along line $C_3C_3'$ of FIG. 3C. First portions 310a of temporal gate electrode 310 are formed on isolation structure 108 and cover fin structures 104. First portions 310a are spaced apart from each other, but are electrically connected by second portions 310b.

Figure 3D:
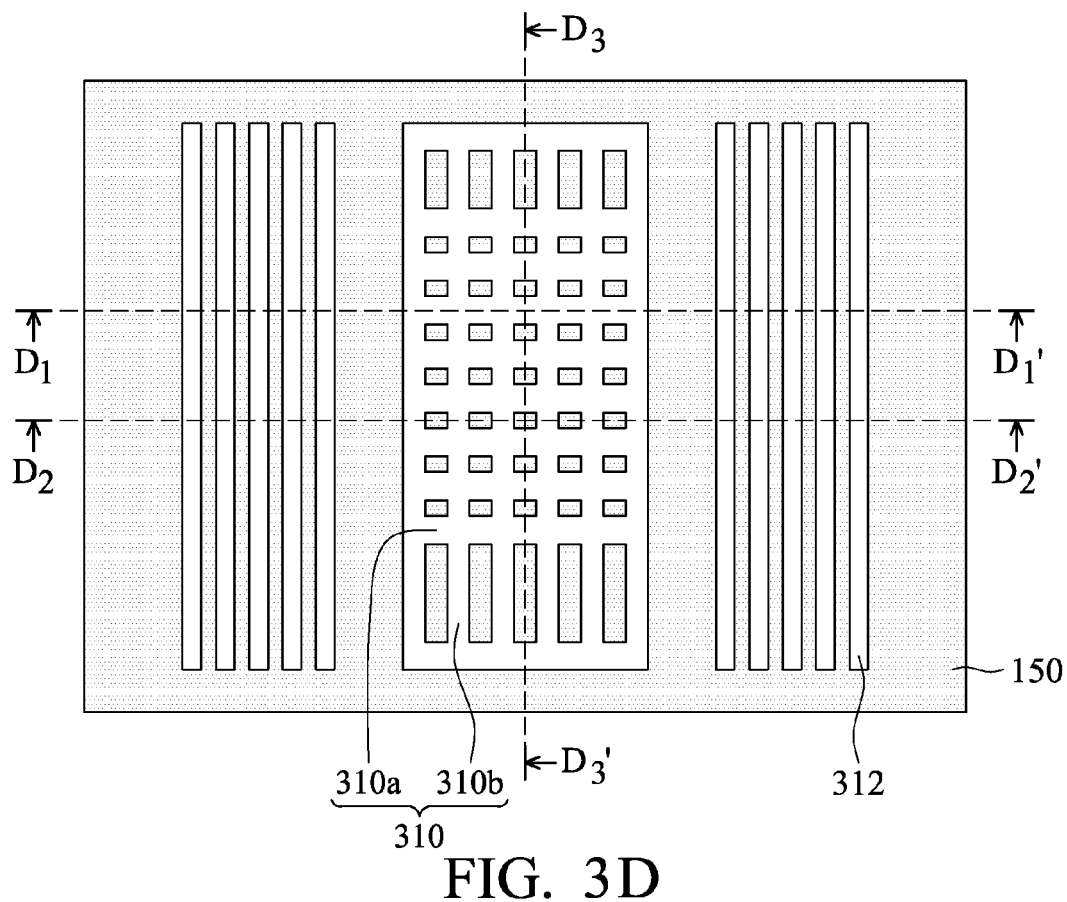
Figure 3D:
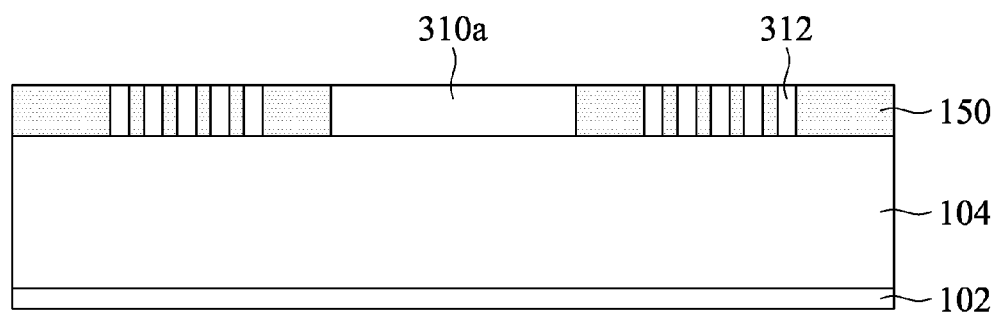
Figure 3D:
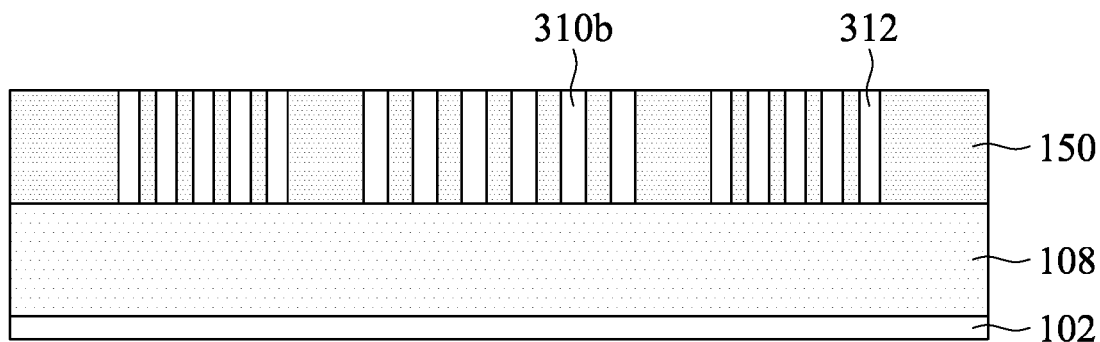
Figure 3D:
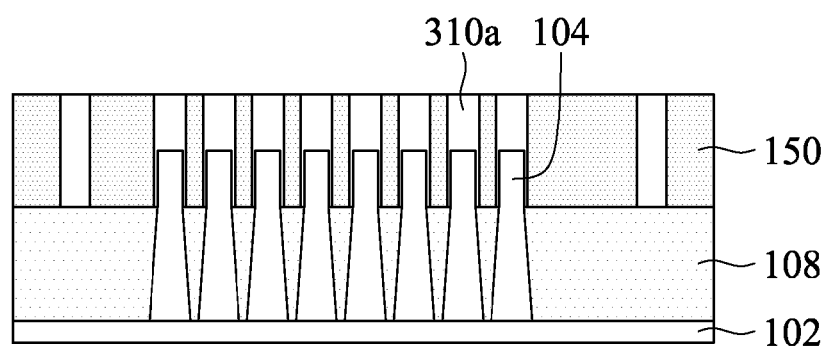
Figure 3:
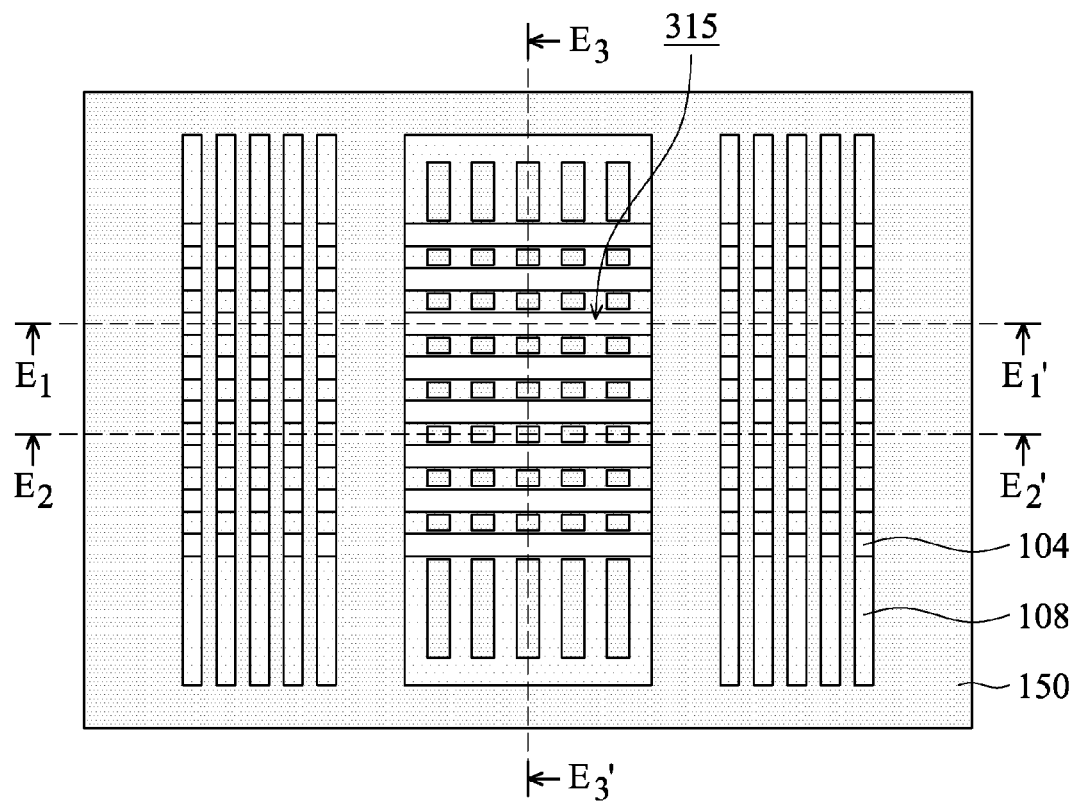
Figure 3:
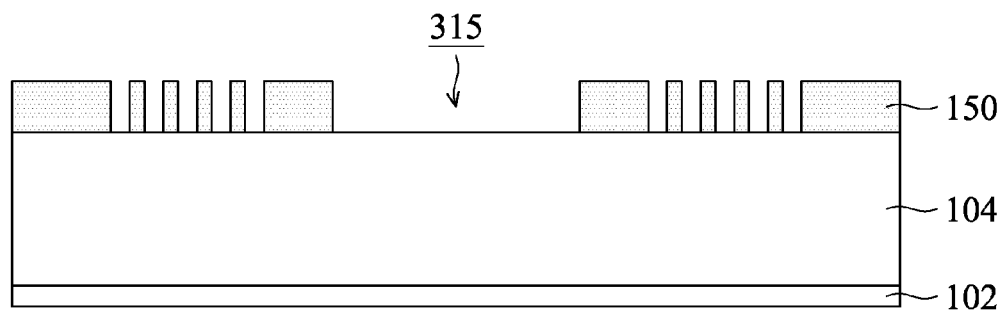

After temporal gate electrode 310 is formed, a dielectric material is filled into recesses 311 and 313 as shown in FIG. 3D, in accordance with some embodiments of the disclosure. Afterwards, a planarizing process is performed to remove the excess dielectric material and to expose a top surface of temporal gate electrode 310 and intermediate dummy gate electrodes 312. As a result, an inter-layer dielectric (ILD) structure 150 is formed. In some embodiments, the planarizing process is a chemical mechanical polishing (CMP) process.

ILD structure 150 may include any suitable material, such as a silicon oxide, silicon oxynitride, borosilicate glass (BSG), phosphoric silicate glass (PSG), borophosphosilicate glass (BPSG), fluorinated silicate glass (FSG), low-k material, porous dielectric material, and/or combinations thereof. Examples of low-k dielectric materials may include, but are not limited to, fluorinated silica glass (FSG), carbon doped silicon oxide, amorphous fluorinated carbon, parylene, bis-benzocyclobutenes (BCB), or polyimide. ILD structure 150 is formed by any suitable processes, such as a chemical vapor deposition (CVD) process, high-density plasma chemical vapor deposition (HDPCVD) process, spin-on process or sputtering process.

In some embodiments, before forming ILD structure 150, a contact etch stop layer (CESL) (not shown) is optionally formed over substrate 102. The CESL may be silicon nitride, silicon oxide, silicon oxynitride, or other applicable materials.

FIG. 3D' is a cross-sectional representation taken along line $D_1D_1'$ of FIG. 3D. First portions 310a of temporal gate electrode 310, intermediate dummy gate electrodes 312 and ILD structure 150 are co-planar.

FIG. 3D" is a cross-sectional representation taken along line $D_2D_2'$ of FIG. 3D. ILD structures 150 are interposed between two adjacent second portions 310b of temporal gate electrode 310. In addition, ILD structures 150 are interposed between two adjacent intermediate dummy gate electrodes 312.

FIG. 3D''' is a cross-sectional representation taken along line $D_3D_3'$ of FIG. 3D. First portion 310a of temporal gate electrode 310 is formed between fin structure 104 and ILD structures 150.

Figure 3E:
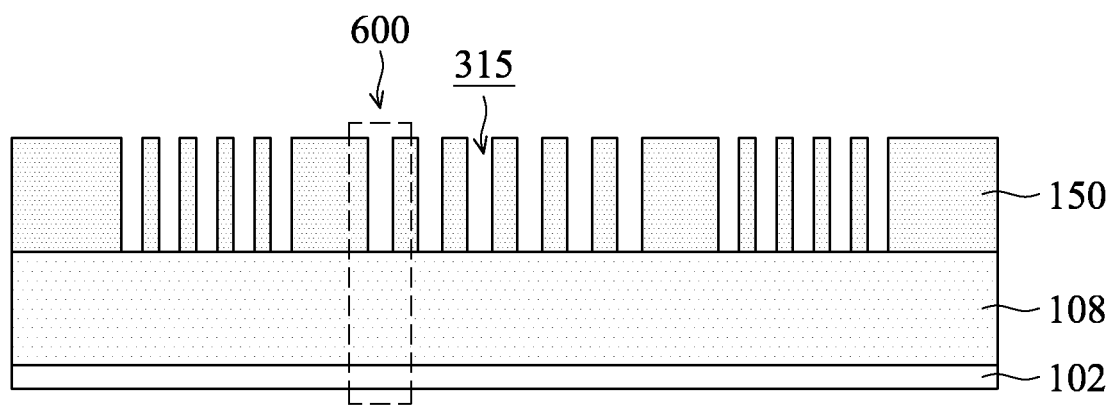
Figure 3E:
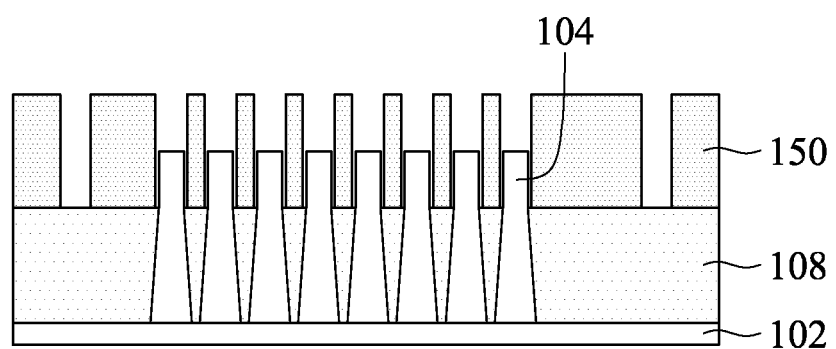
Figure 3:
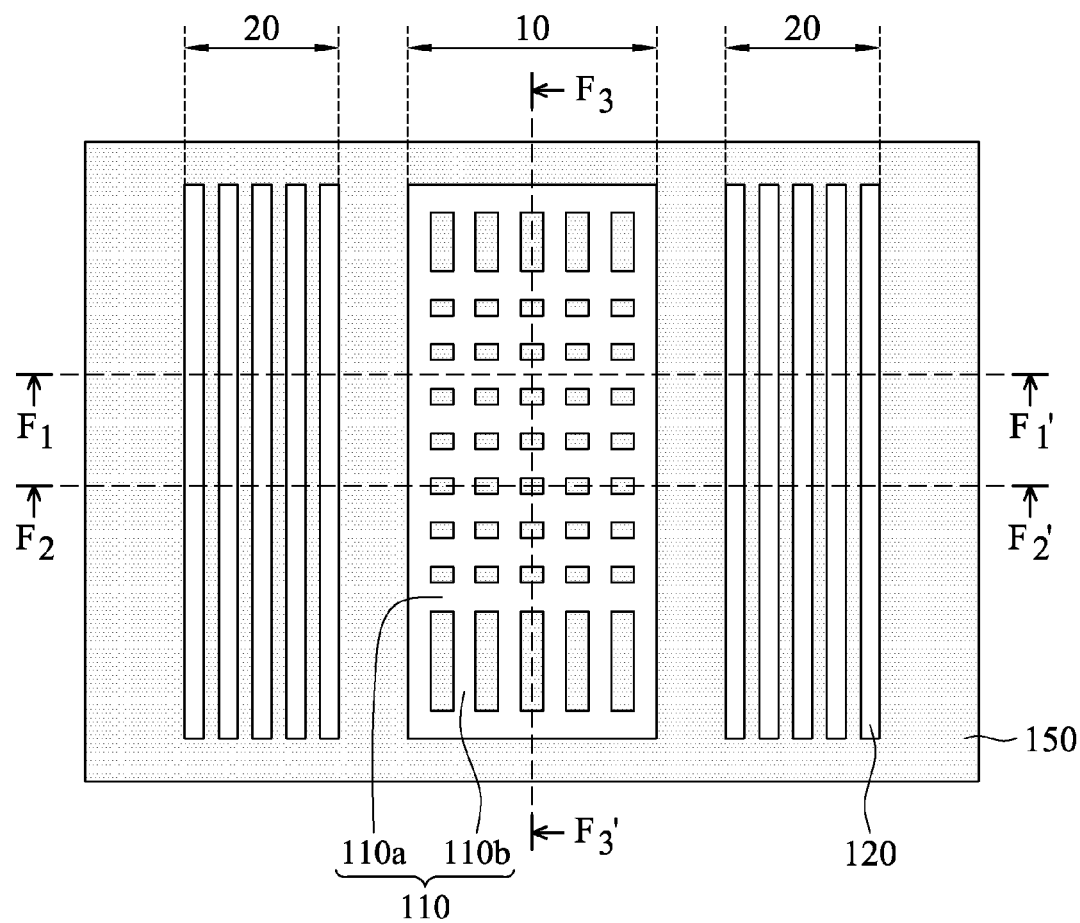
Figure 3:
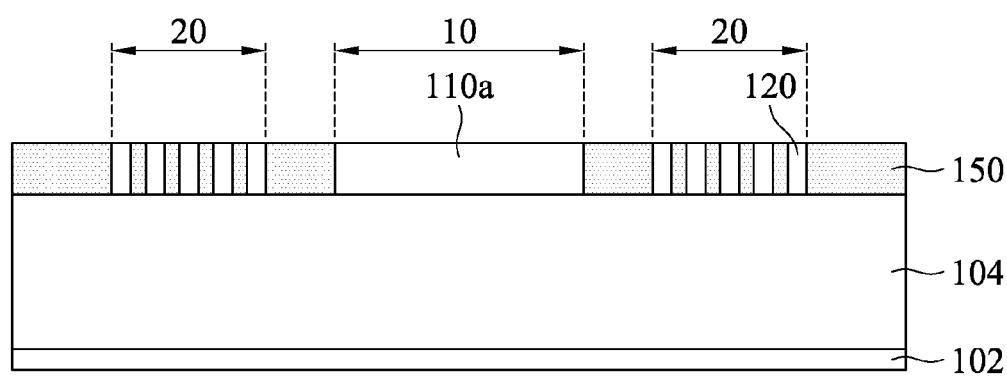

After ILD structure 150 is formed, temporal gate electrode 310 and intermediate dummy gate electrodes 312 are removed as shown in FIG. 3E, in accordance with some embodiments of the disclosure. Therefore, a number of trenches 315 are formed to expose a portion of fin structures 104 and a portion of isolation structure 108. In some embodiments, temporal gate electrode 310 and intermediate dummy gate electrodes 312 are removed by an etching process, such as a wet etching process or a dry etching process.

FIG. 3E' is a cross-sectional representation taken along line $E_1E_1'$ of FIG. 3E. In the middle portion of FIG. 3E', temporal gate electrode 310 is removed to expose fin structures 104. In the side portion of FIG. 3E', dummy gate electrodes 312 are removed to expose fin structures 104.

FIG. 3E" is a cross-sectional representation taken along line $E_2E_2'$ of FIG. 3E. ILD structure 150 is formed on isolation structure 108.

FIG. 3E''' is a cross-sectional representation taken along line $E_3E_3'$ of FIG. 3E. ILD structure 150 is formed on isolation structure 108. ILD structure 150 has a number of portions, and fin structures 104 are formed between two adjacent portions of ILD structure 150.

Figure 3F:
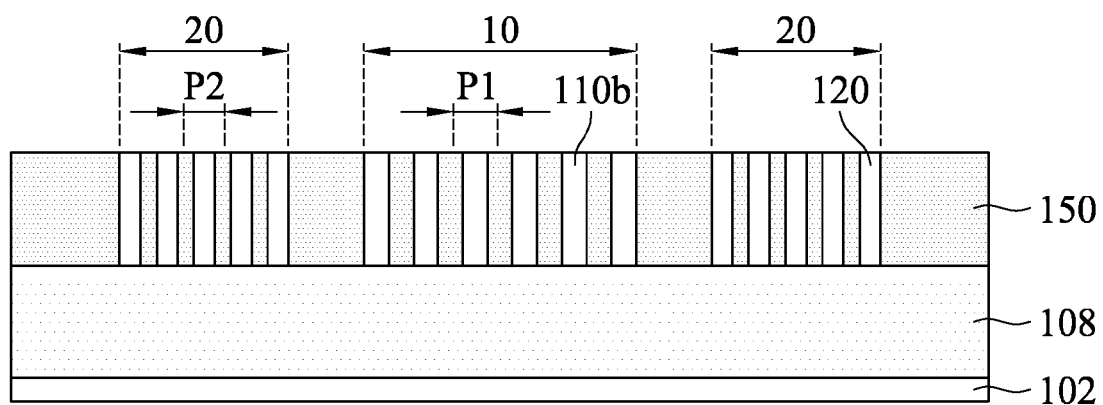
Figure 3F:
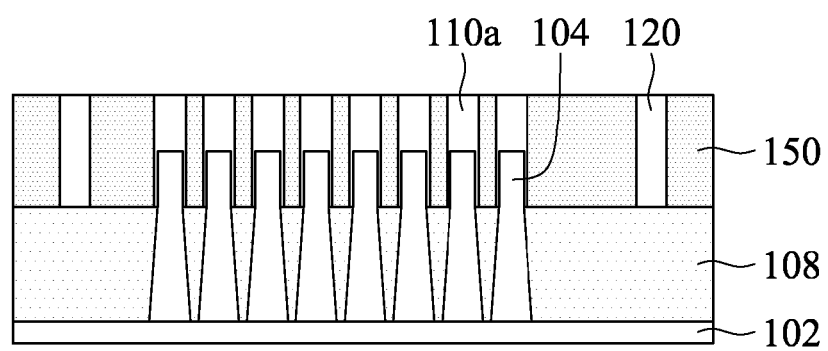

After temporal gate electrode 310 and intermediate dummy gate electrodes 312 are removed, gate material is filled into trenches 315, as shown in FIG. 3F, in accordance with some embodiments of the disclosure. As a result, a gate region 10 including gate electrode 110 and a dummy region 20 including dummy gate electrodes 120 are formed. Gate electrode 110 has a grid-like pattern when seen from a top-view. Gate electrode 110 has a number of first portions 110a and a number of second portions 110b. First portions 110a of gate electrode 110 are parallel to fin structures 104. Dummy gate electrodes 120 are parallel to second portions 110b of gate electrode 110.

It should be noted that although gate electrode 110 has a number of first portions 110a and second portions 110b when seen from the top-view, the first portions 110a and second portions 110b are electrically connected to each other. Alternatively, each of dummy gate electrodes 120 is independent and separate from each other.

A source region and a drain region (not shown) are formed in fin structures 104 on opposite sides of gate electrode 110, and a channel region is interposed between the source region and the drain region. The channel region has a channel length equal to the length L of gate electrode 110. In some embodiments, the channel length is in a range from about 60 nm to about 360 nm.

In addition, high-k dielectric layer (not shown) is formed before gate electrode 110. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like. High-k dielectric layer (not shown) is formed by deposition processes, such as a CVD process, HDPCVD process, spin-on process, sputtering process, and/or combinations thereof.

Gate electrode 110 includes N-work-function metal or P-work-function metal. The N-work-function metal includes tungsten (W), copper (Cu), titanium (Ti), silver (Ag), aluminum (Al), titanium aluminum alloy (TiAl), titanium alumina nitride (TiAlN), tantalum carbide (TaC), tantalum carbon nitride (TaCN), tantalum silicon nitride (TaSiN), manganese (Mn), or zirconium (Zr). The P-work-function metal includes titanium nitride (TiN), tungsten nitride (WN), tantalum nitride (TaN), or ruthenium (Ru). Any applicable process, such as a physical vapor deposition (PVD) process, chemical vapor deposition (CVD) process, plating process, electroless plating process, and/or the like, may be performed to form gate electrode 110. In some embodiments, the material of dummy gate electrodes 120 is the same as that of gate electrode 110.

FIG. 3F' is a cross-sectional representation taken along line $F_1F_1'$ of FIG. 3F. In gate region 10, first portions 110a of gate electrode 110 are formed on fin structure 104. In dummy region 20, dummy gate electrodes 120 are formed on fin structures 104.

FIG. 3F" is a cross-sectional representation taken along line $F_2F_2'$ of FIG. 3F. Second portions 110b of gate electrode 110 and dummy gate electrodes 120 are formed on isolation structure 108.

FIG. 3F''' is a cross-sectional representation taken along line $F_3F_3'$ of FIG. 3F. First portions 110a of gate electrode 110 are formed on isolation structure 108. A portion of the ILD structure 150 is directly formed on isolation structure 108 and between two adjacent first portions 110a of gate electrode 110.

Figure 3G:
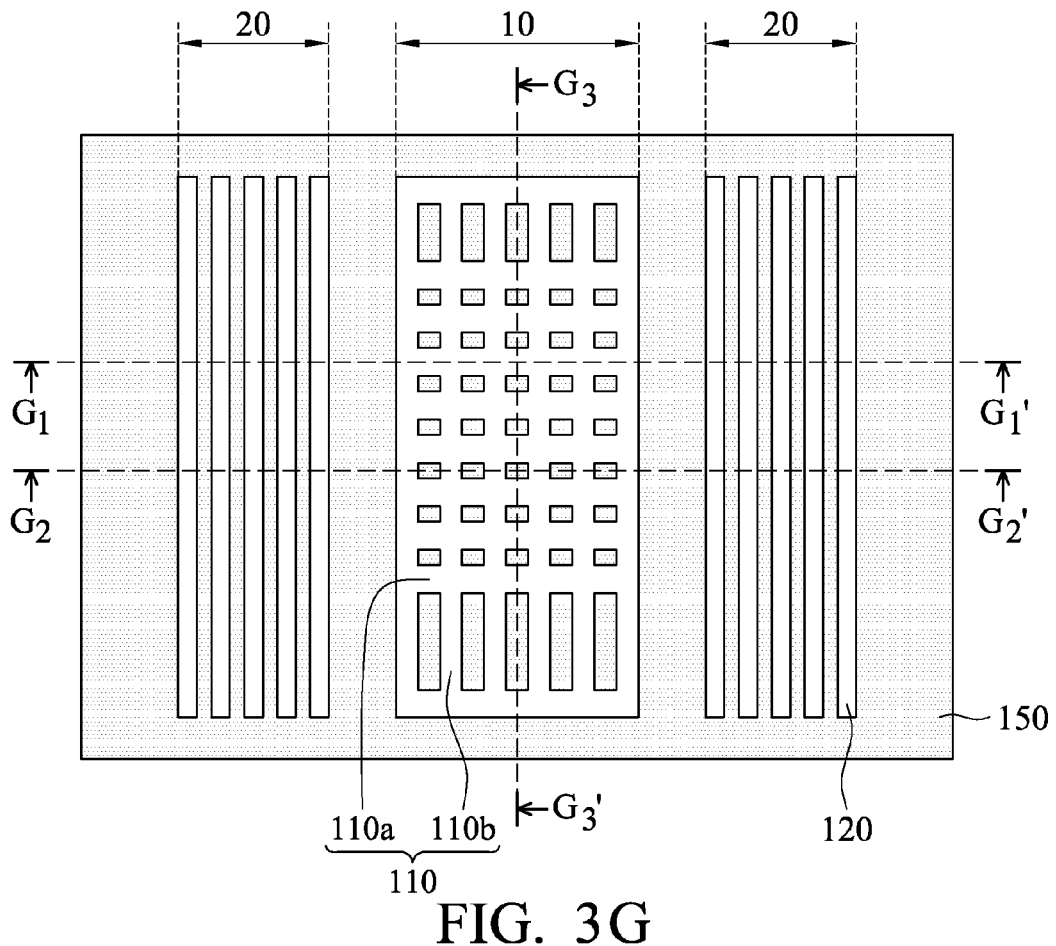
Figure 3G:
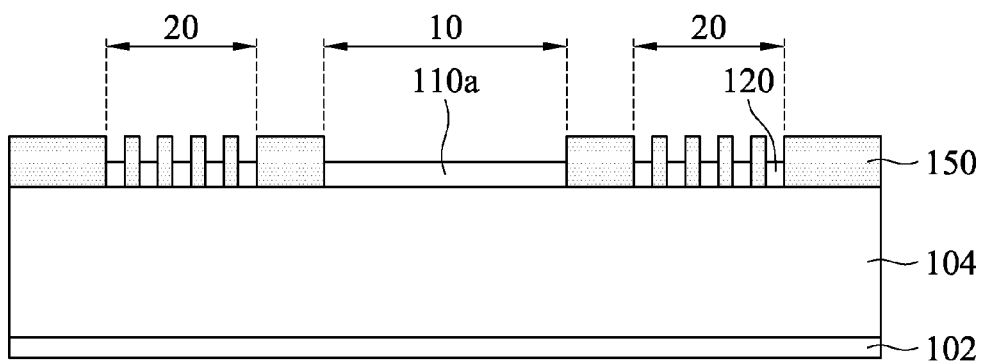
Figure 3G:
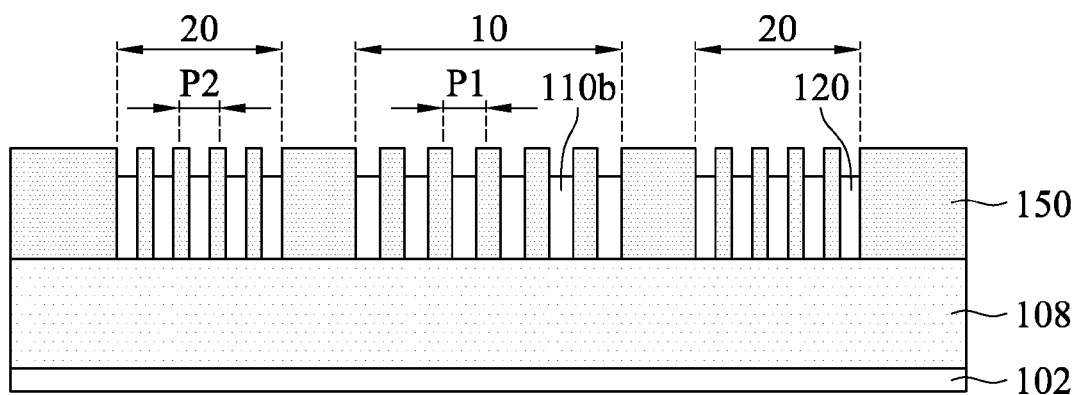
Figure 3G:
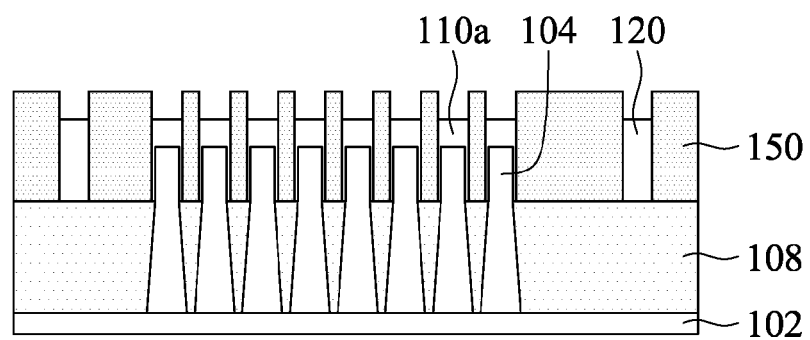

After gate electrode 110 is formed, an upper portion of gate electrode 110 is removed, as shown in FIG. 3G, in accordance with some embodiments of the disclosure. In some embodiments, the portion of gate electrode 110 is removed by an etching process, such as a wet etching process or a dry etching process.

FIG. 3G' is a cross-sectional representation taken along line $G_1G_1'$ of FIG. 3G. In gate region 10, a top surface of ILD structure 150 is higher than a top surface of gate electrode 110. In dummy region 20, a top surface of ILD structure 150 is higher than top surfaces of dummy gate electrodes 120.

FIG. 3G" is a cross-sectional representation taken along line $G_2G_2'$ of FIG. 3G. A top surface of second portions 110b of gate electrode 110 is lower than a top surface of ILD structure 150.

FIG. 3G''' is a cross-sectional representation taken along line $G_3G_3'$ of FIG. 3G. A top surface of first portions 110a of gate electrode 110 is higher than top surfaces of fin structures 104, but is lower than a top surface of ILD structure 150. Because the upper portions of gate electrode 110 are removed, gate electrode 110 and ILD structure 150 form a stair-like pattern.

Figure 3H:
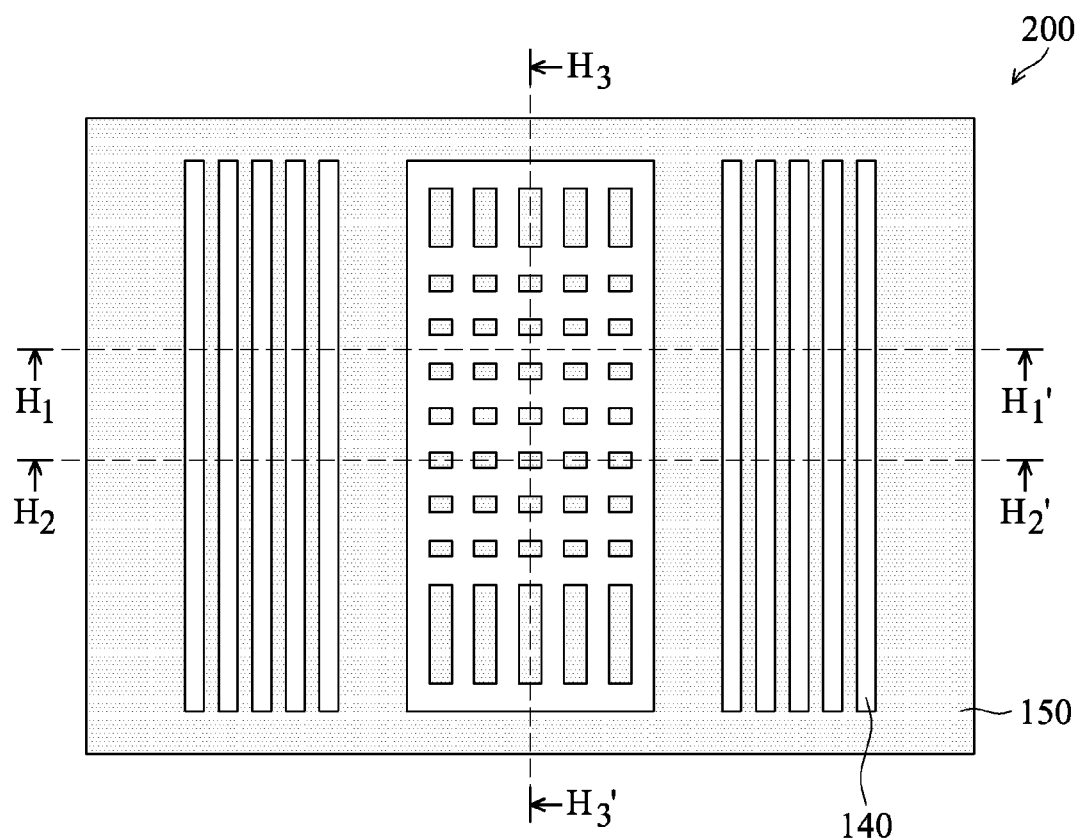
Figure 3H:
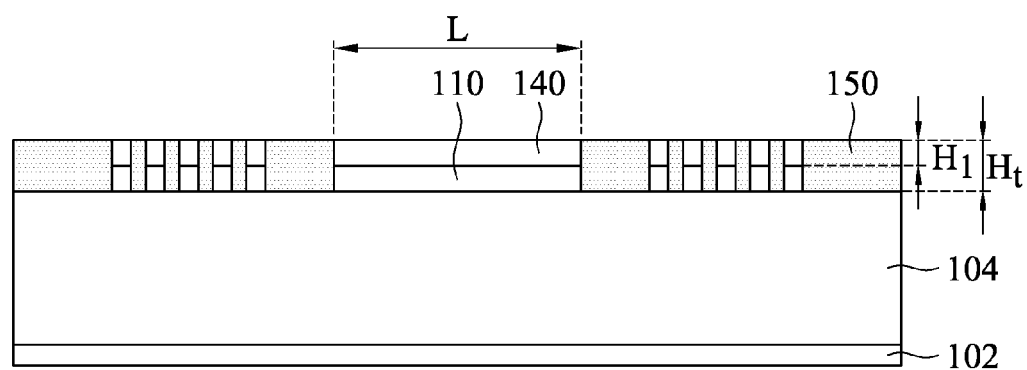
Figure 3H:
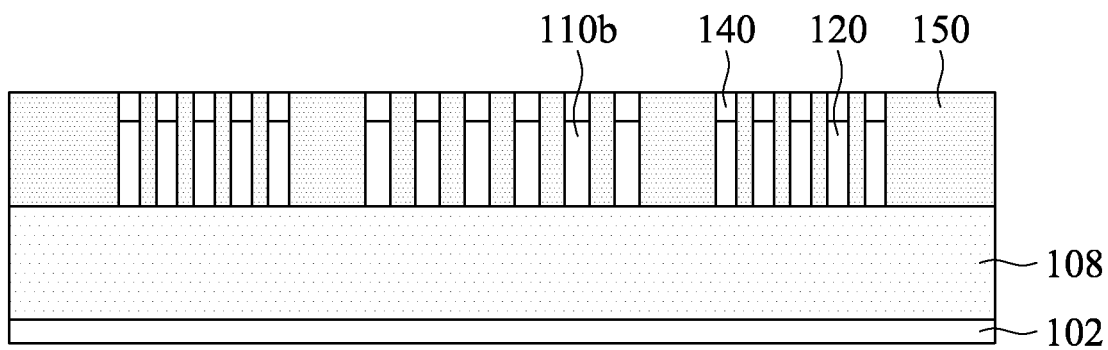
Figure 3H:
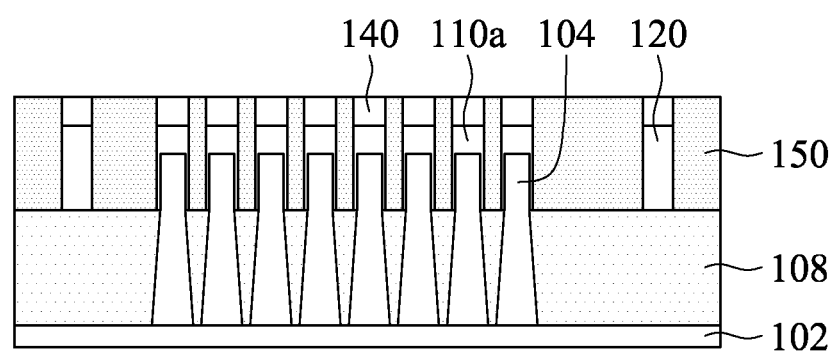

Afterwards, capping layer 140 is formed on gate electrode 110 as shown in FIG. 3H, in accordance with some embodiments of the disclosure. Capping layer 140 is used to electrically isolate gate electrode 110 from a contact structure (not shown, formed by subsequent process). In some embodiments, capping layer 140 is made of silicon nitride, silicon oxide, silicon carbide, silicon nitride doped with carbon, silicon oxynitride, aluminum oxide, boron nitride, boron carbide, and other low-k dielectric materials or low-k dielectric materials doped with one or more of carbon, nitrogen, and hydrogen.

FIG. 3H' is a cross-sectional representation taken along line $H_1H_1'$ of FIG. 3H. Capping layer 140 has a height $H_1$, and a total height of gate electrode 110 and capping layer 140 is marked as $H_t$. In some embodiments, a gate electrode height $(H_t - H_1)$ is in a range from about 8 nm to about 40 nm. In some embodiments, a ratio $(H_1/H_t)$ of height $H_1$ to total height $H_t$ is in a range from about 0.3 to about 1.5. It should be noted that if the ratio $(H_1/H_t)$ is too low, capping layer 140 is too thin to sufficiently isolate gate electrode 110 and the contact structure (not shown). If the gate electrode height $(H_t - H_1)$ is too low (or ratio $(H_1/H_t)$ is too high), the function of gate electrode 110 may be degraded.

In some embodiments, gate electrode 110 has a length L. In some embodiments, length L is in a range from about 36 nm to about 360 nm.

FIG. 3H" is a cross-sectional representation taken along line $H_2H_2'$ of FIG. 3H. Capping layer 140 is over gate electrode 110 and dummy gate electrodes 120.

FIG. 3H''' is a cross-sectional representation taken along line $H_2H_2'$ of FIG. 3H. Capping layer 140 is over fin structures 104, first portion 110a of gate electrode 110 and dummy gate electrodes 120.

It should be noted that if the upper portion of gate electrode 110 is not completely removed, capping layer 140 on the gate electrode 110 may be too thin to isolate gate electrode 110 from the contact structure. If gate electrode 110 is overetched, fin structures 104 underlying gate electrode 110 may also be etched. As a result, an undesirable gate-leakage problem within occurs. Therefore, the amount of etching gate electrode 110 should be controlled within a predetermined range.

However, for regions with different exposed areas (or etched areas), it is difficult to control etching uniformity due to the loading effect. Depending on the integration of gate electrode materials and etching strategy, the loading effect is the etching rate for a larger exposed area being either faster or slower than it is for a smaller exposed area. In other words, the loading effect is that the etching rate in large area is mismatched the etching rate in small area. Therefore, compared to a gate electrode having a small area, it is more difficult to reach predetermined etching depth in a gate electrode having a large area. In order to reduce the loading effect, gate electrode 110 is designed to have a grid-like pattern. In other words, gate electrode 110 with a grid-like pattern has a smaller area than a gate electrode with a rectangular pattern, and therefore the loading effect is reduced.

In addition, the loading effect may also be affected by pattern density. In order to reduce the pattern-density difference between the gate region 10 and dummy region 20, dummy gate electrode 120 may also be designed to have a pitch between two adjacent dummy gates close to the pitch between two portions of gate electrode. For example, the pitch $P_2$ between two adjacent dummy gate electrodes 312 is close to the pitch $P_1$ between two adjacent second portions 110b of gate electrode 110 ($P_1$ and $P_2$ are shown in FIG. 3F").

Therefore, FinFET device structure 200 is obtained. Afterwards, FinFET device structure 200 may continue to undergo other processes to form other structures or devices.

FIGS. 4A-4F show top-view representations of various stages of forming a fin field effect transistor (FinFET) device structure 200, in accordance with some embodiments of the disclosure.

Figure 4A:
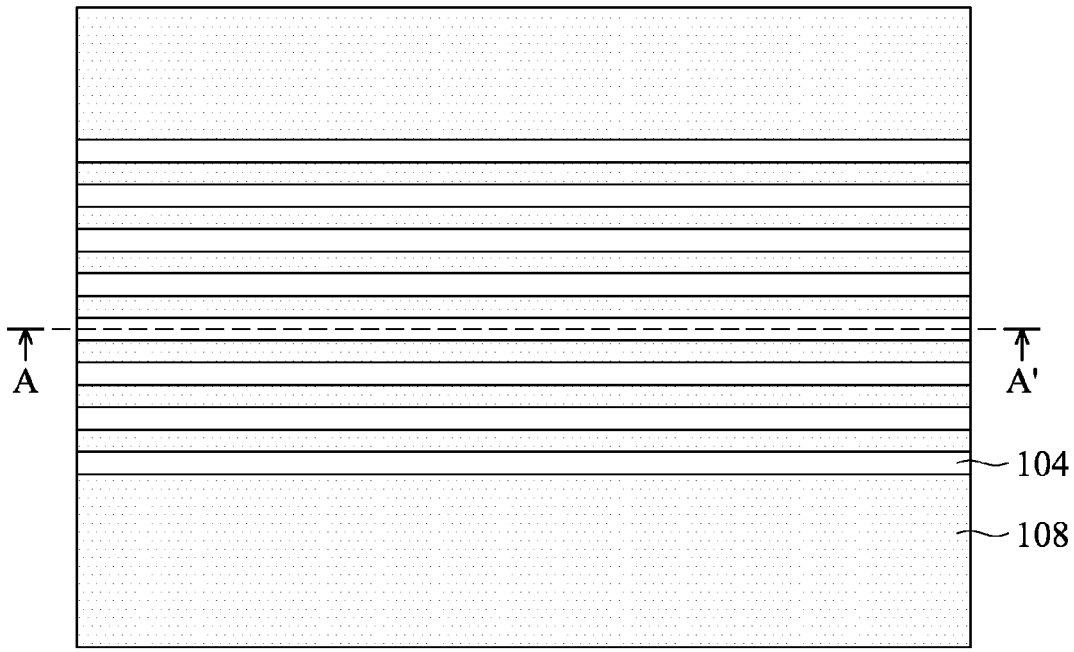
FIGS. 4A-4F show top-view representations of various stages of forming a fin field effect transistor (FinFET) device structure, in accordance with some embodiments of the disclosure.
Figure 4A:
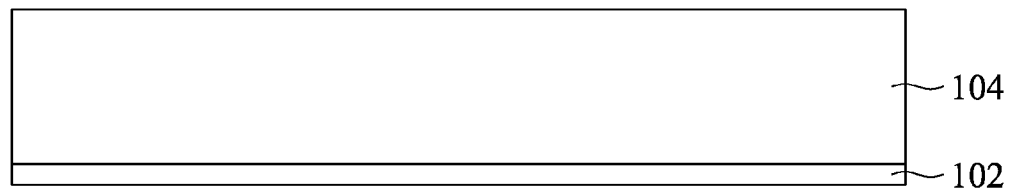

FIG. 4A shows a top-view representation, and FIG. 4A' is a cross-sectional representation taken along line AA' of FIG. 4A. Fin structures 104 are formed over substrate 102.

Figure 4B:
Figure 4B:
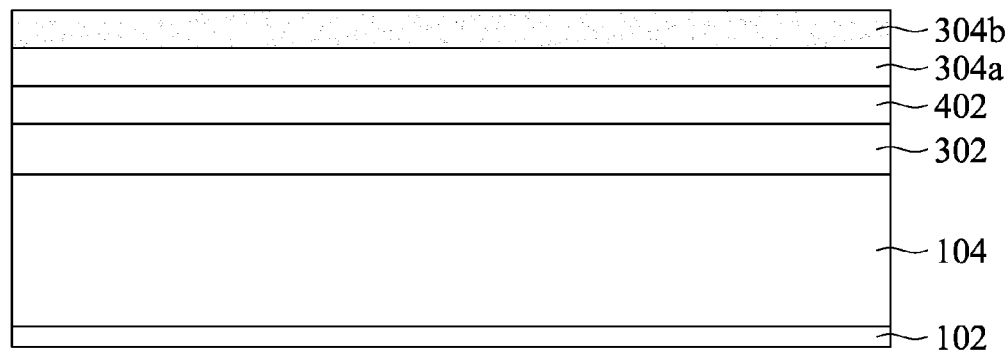

After fin structures 104 are formed, a polysilicon layer 302, a hard mask layer 402, and photoresist layers 304a, 304b are sequentially formed on fin structures 104 as shown in FIG. 4B, in accordance with some embodiments of the disclosure. FIG. 4B' is a cross-sectional representation taken along line BB' of FIG. 4B. In some embodiments, hard mask layer 402 is made of silicon oxide, silicon nitride, silicon oxynitride, or other applicable materials.

Figure 4C:
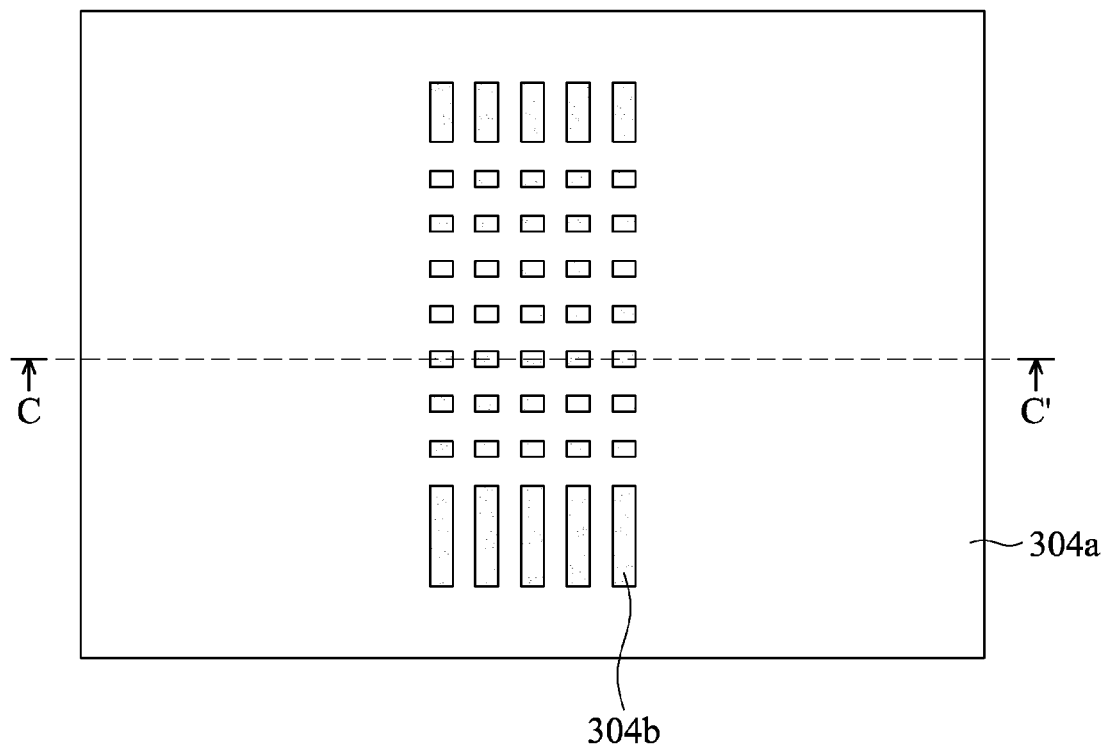
Figure 4C:
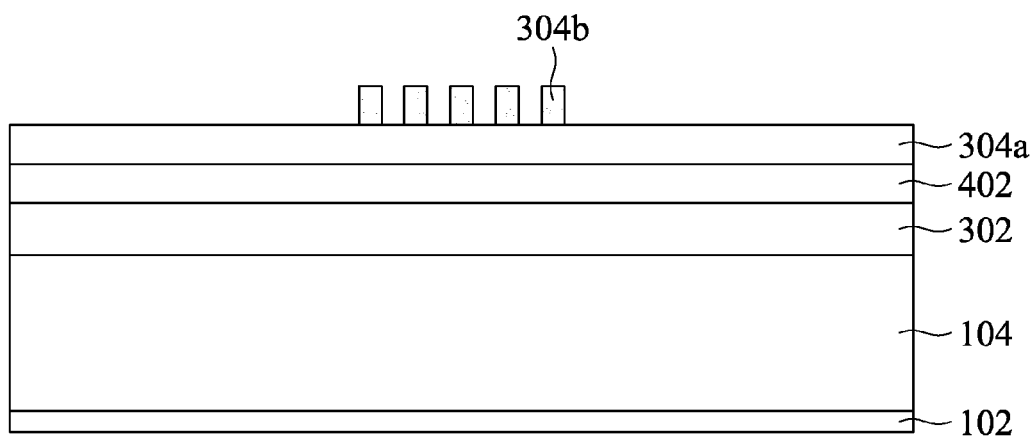

After photoresist layers 304a and 304b are formed, photoresist layer 304b is patterned to form a patterned photoresist layer 304b, as shown in FIG. 4C, in accordance with some embodiments of the disclosure. As a result, patterned photoresist layer 304b has a grid-like pattern.

FIG. 4C' is a cross-sectional representation taken along line CC' of FIG. 4C. Patterned photoresist layer 304b having grid-like pattern is formed over hard mask layer 402 and photoresist layers 304a.

Figure 4D:
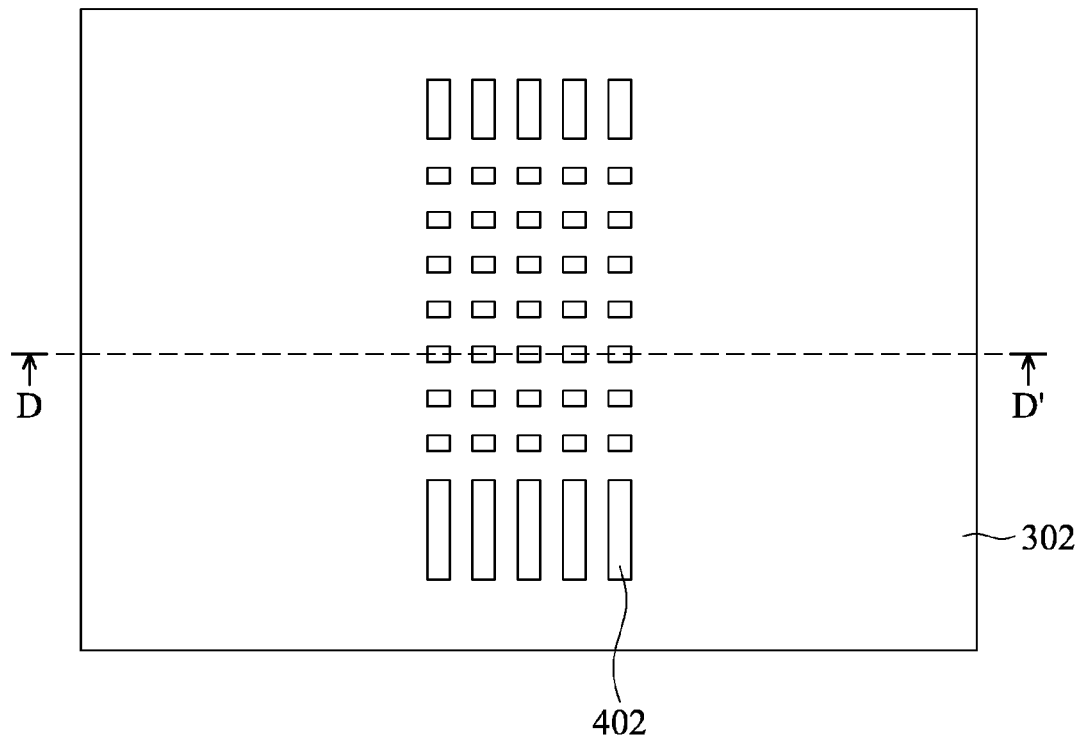
Figure 4D:
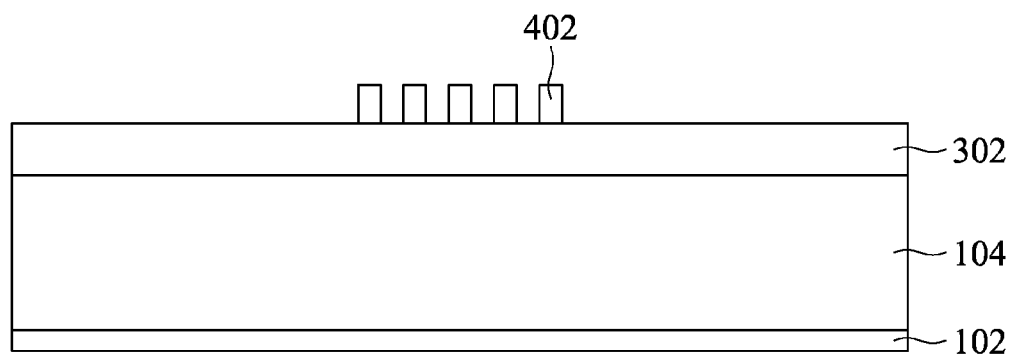

After forming patterned photoresist layers 304a, the pattern of patterned photoresist layers 304a is transferred to hard mask layer 402, as shown in FIG. 4D, in accordance with some embodiments of the disclosure. Therefore, a patterned hard mask layer 402 having a grid-like pattern is obtained.

FIG. 4D' is a cross-sectional representation taken along line DD' of FIG. 4D. Patterned hard mask layer 402 is formed on polysilicon layer 302.

Figure 4E:
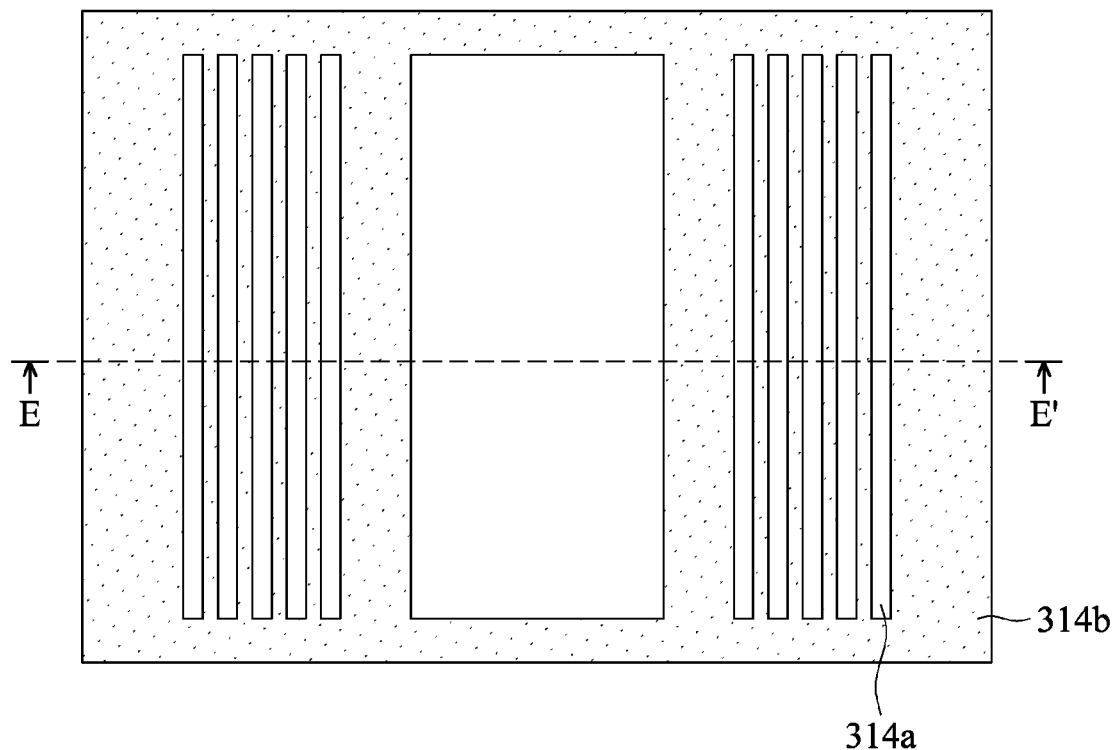
Figure 4E:
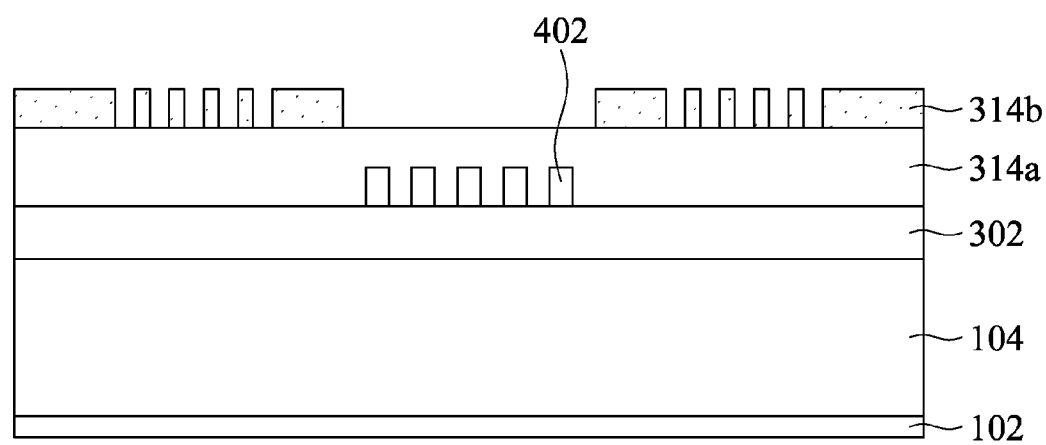

After forming a patterned hard mask layer 402, other photoresist layers 314a, 314b are formed on patterned hard mask layer 402 and then patterned to form a patterned photoresist layer 314b, as shown in FIG. 4E, in accordance with some embodiments of the disclosure.

FIG. 4E' is a cross-sectional representation taken along line EE' of FIG. 4E. Patterned photoresist layer 314b is used to define the pattern of intermediate dummy gate electrodes 312, and the pattern of patterned hard mask layer 402 is used to define the pattern of temporal gate electrode 310.

Figure 4F:
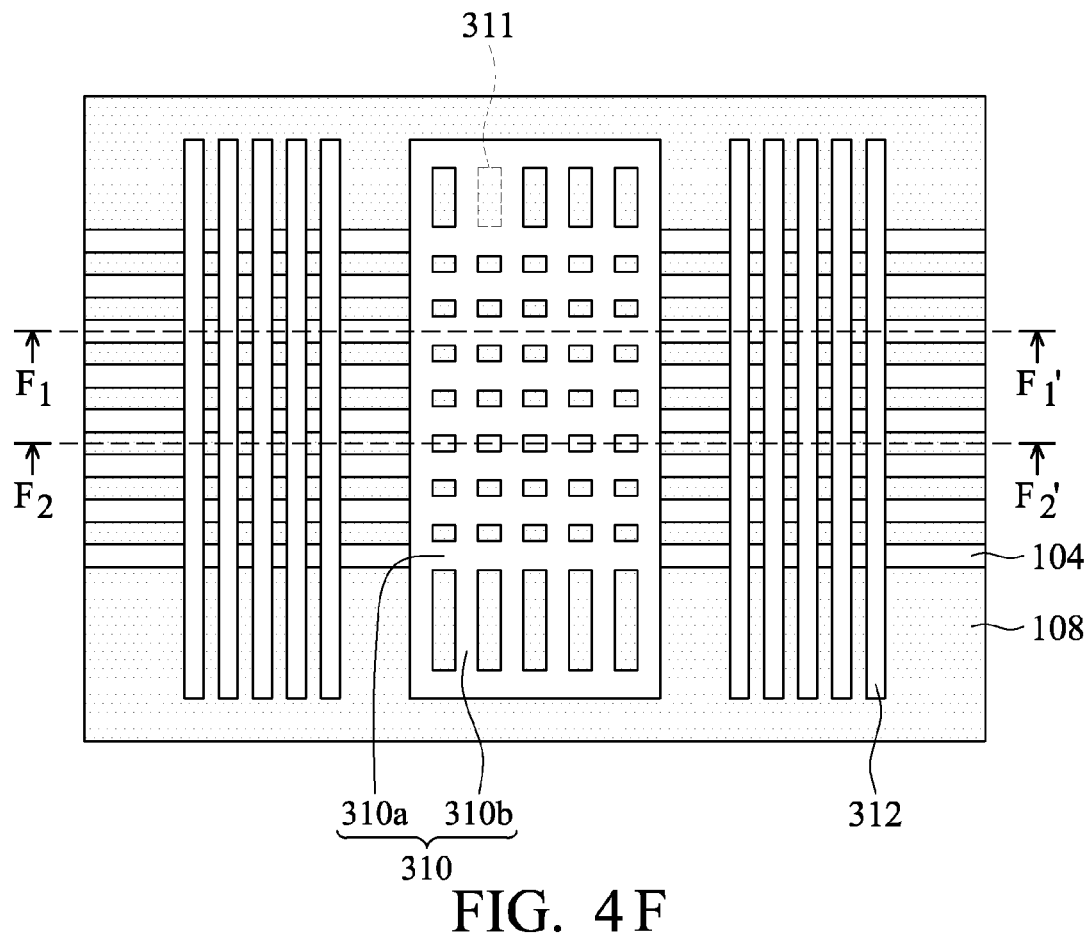
Figure 4F:
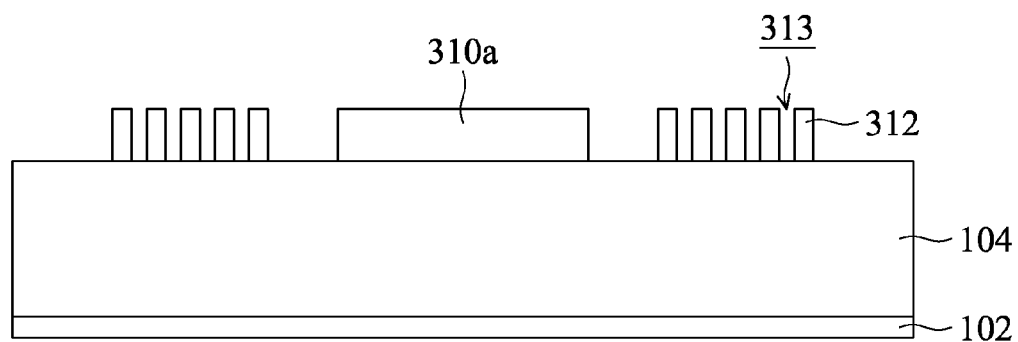

After patterned photoresist layer 314b is formed, a portion of polysilicon layer 302 is removed by using patterned photoresist layer 314b and patterned hard mask layer 402 as a mask as shown in FIG. 4F, in accordance with some embodiments of the disclosure. As a result, a temporal gate electrode 310 and a number of intermediate dummy gate electrodes 312 are formed.

Note that temporal gate electrode 310 has a grid-like pattern when seen from a top-view. Temporal gate electrode 310 has a number of first portions 310a and a number of second portions 310b. First portions 310a are parallel to fin structures 104, and second portions 310b are perpendicular to fin structures 104. More specifically, the recesses 311 are enclosed by first portions 310a and second portions 310b, and the recesses 311 are in the shape of a circle, rectangle, ellipse, square, or polygon when seen from a top view.

FIG. 4F' is a cross-sectional representation taken along line $F_1F_1'$ of FIG. 4F. In the middle portion of FIG. 4F', first portions 310a of temporal gate electrode 310 are formed over fin structure 104. In the side portion of FIG. 4F', a number of intermediate dummy gate electrodes 312 are formed on fin structures 104, and recesses 313 are formed between adjacent intermediate dummy gate electrodes 312.

FIG. 4F" is a cross-sectional representation taken along line $F_2F_2'$ of FIG. 4F. Second portions 310b of temporal gate electrode 310 are formed on isolation structure 108. Second portions 310b of temporal gate electrode 310 are spaced apart from each other.

Afterwards, structure of FIG. 4F may continue with the steps of FIGS. 3D-3H to form other structures or devices. As a result, after the steps of removing temporal gate electrode 310 and intermediate dummy gate electrodes 312, forming ILD structure 150, forming gate electrode 110 and dummy gate electrode 120, and forming capping layer 140, gate electrode 110 with grid-like pattern over fin structures 104 is obtained.

FIGS. 5A-5F show top-view representations of various stages of forming a fin field effect transistor (FinFET) device structure 200, in accordance with some embodiments of the disclosure. FIGS. 5A-5F show a double patterning lithography (DPL) process. DPL is a process for forming a pattern by dividing the patterns into two interleaved patterns.

Figure 5A:
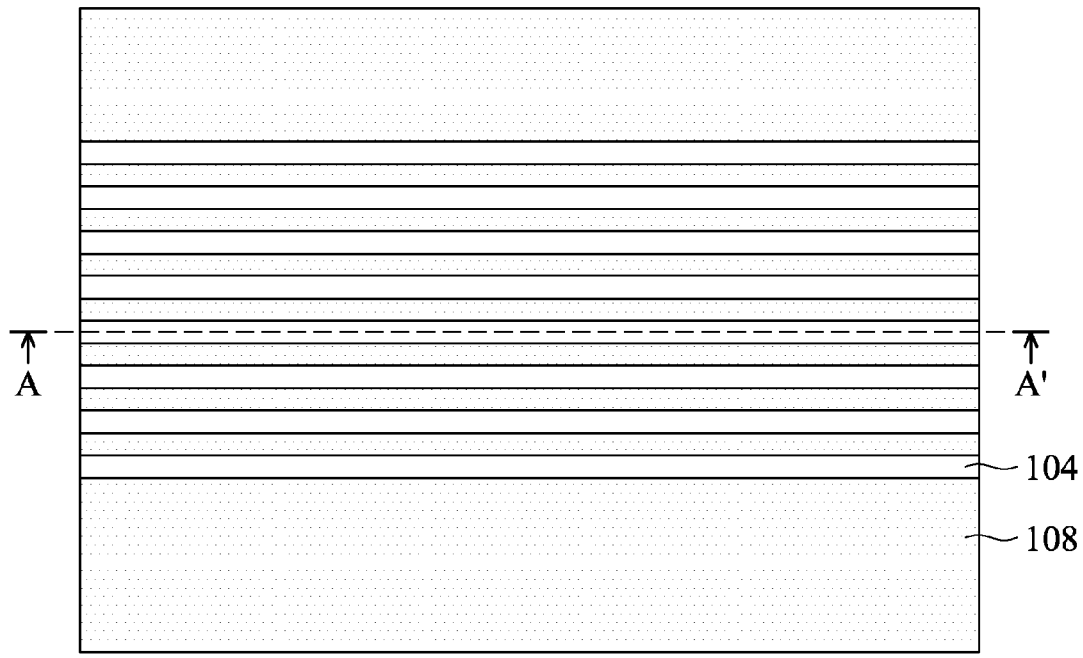
FIGS. 5A-5F show top-view representations of various stages of forming a fin field effect transistor (FinFET) device structure, in accordance with some embodiments of the disclosure.
Figure 5A:
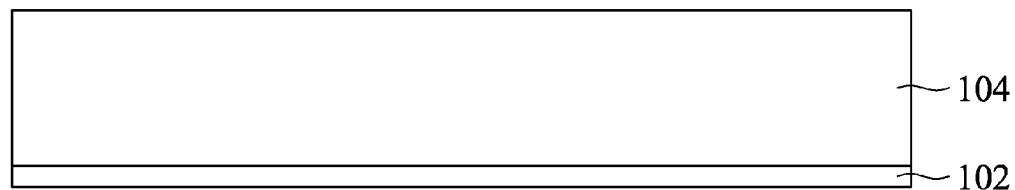
Figure 5B:
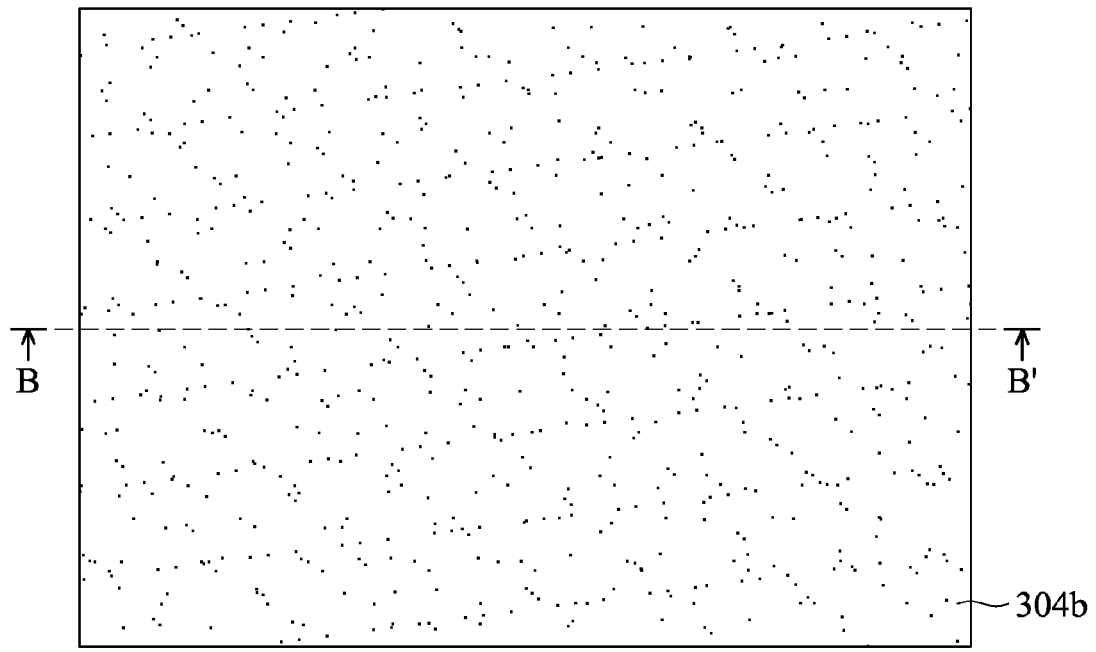
Figure 5B:
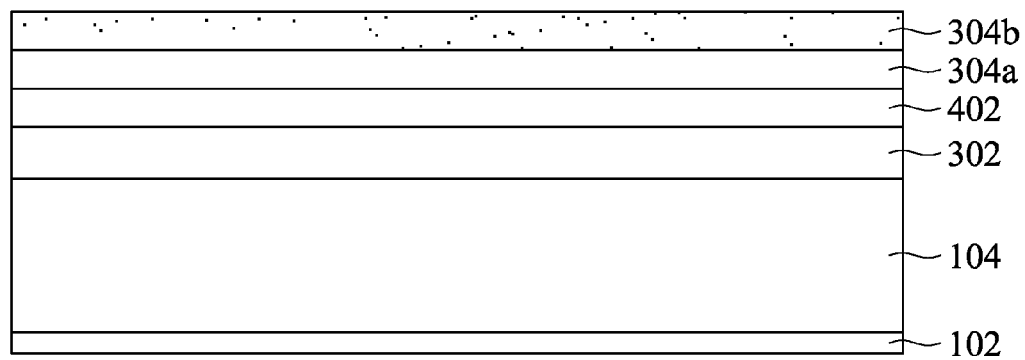

FIGS. 5A, 5B, 5A' and 5B' are respectively like FIGS. 4A, 4B, 5A' and 5B', and are omitted for brevity.

Figure 5C:
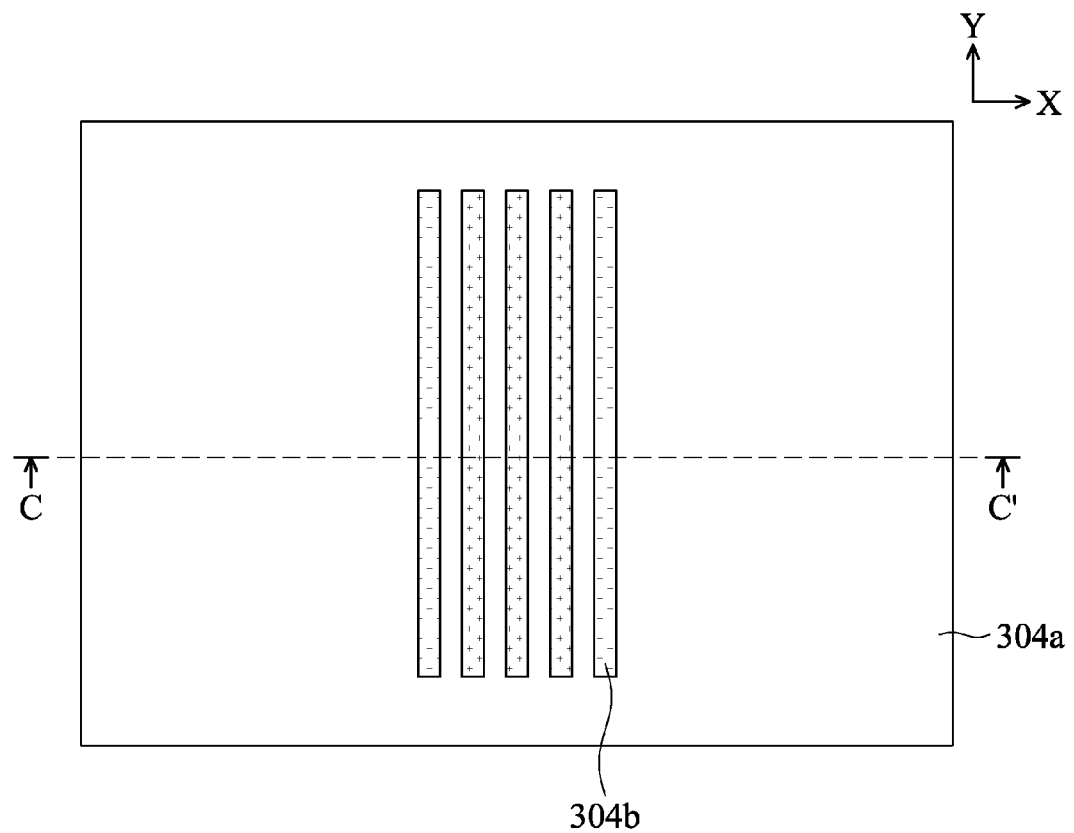
Figure 5C:
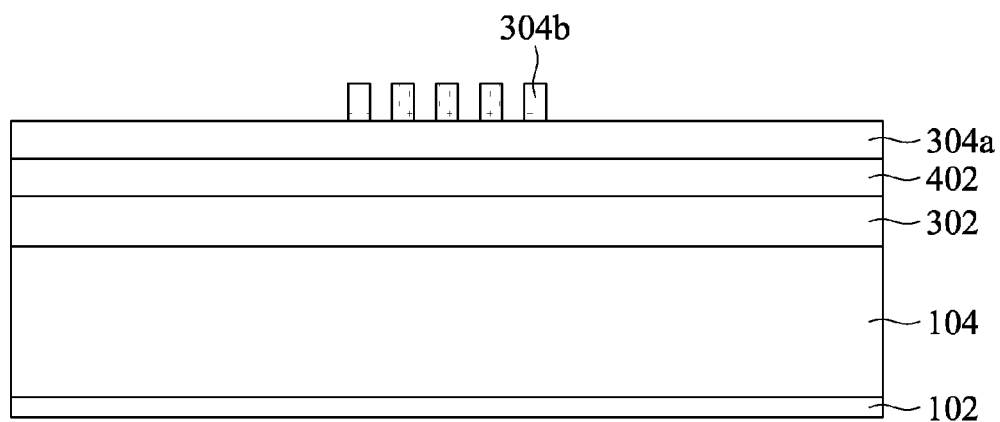

After photoresist layers 304a and 304b are formed, photoresist layer 304b is patterned to form a patterned photoresist layer 304b, as shown in FIG. 5C, in accordance with some embodiments of the disclosure. As a result, patterned photoresist layer 304b has a strip-like pattern along the Y-direction.

FIG. 5C' is a cross-sectional representation taken along line CC' of FIG. 5C. Patterned photoresist layer 304b is formed over hard mask layer 402 and photoresist layers 304a.

Figure 5D:
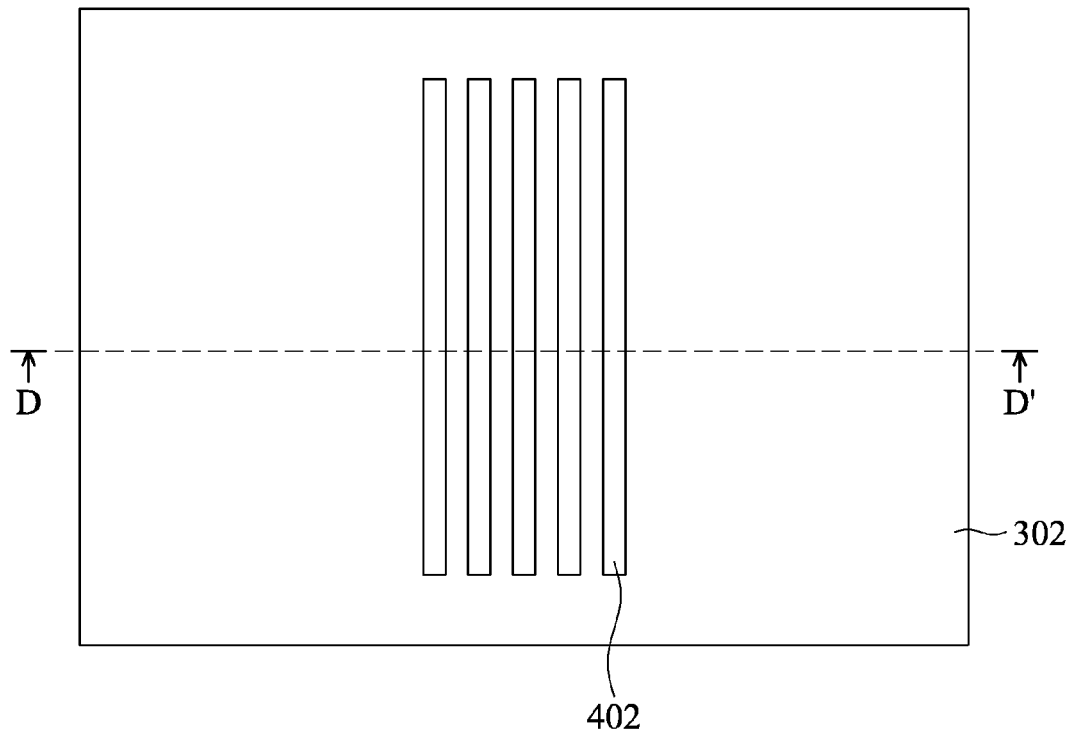
Figure 5D:
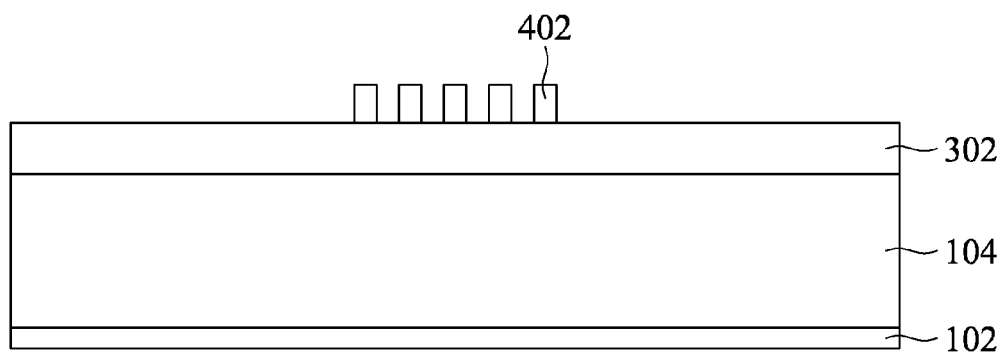

After patterned photoresist layers 304a are formed, the pattern of patterned photoresist layers 304a is transferred to hard mask layer 402, as shown in FIG. 5D, in accordance with some embodiments of the disclosure. FIG. 5D' is a cross-sectional representation taken along line DD' of FIG. 5D. Therefore, a patterned hard mask layer 402 has a strip-like pattern along the Y-direction.

Figure 5E:
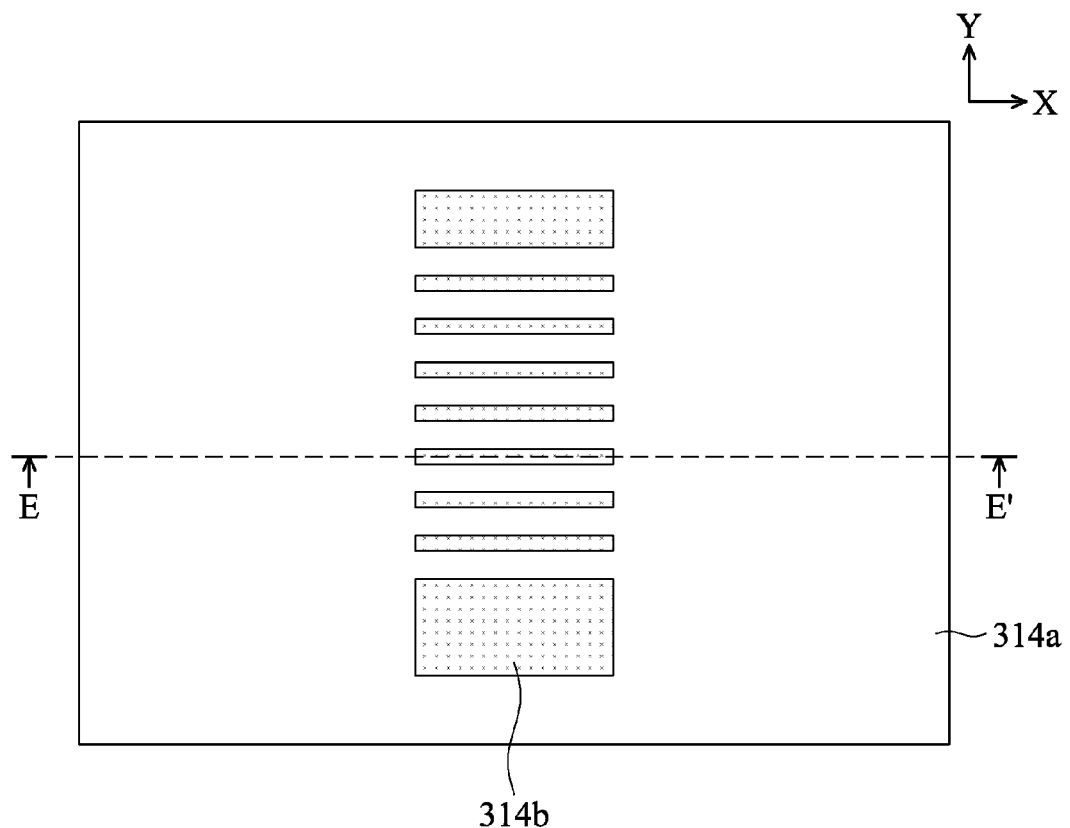
Figure 5E:
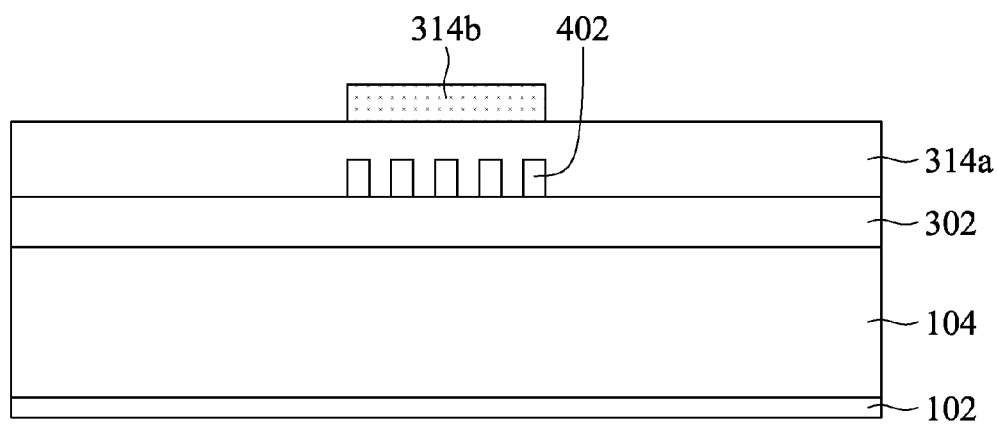

After patterned hard mask layer 402 is formed, other photoresist layers 314a, 314b are formed on patterned hard mask layer 402 and then patterned to form a patterned photoresist layer 314b, as shown in FIG. 5E, in accordance with some embodiments of the disclosure. Note that patterned photoresist layer 314b has a strip-like pattern along the X-direction.

FIG. 5E' is a cross-sectional representation taken along line EE' of FIG. 5E. The pattern of patterned photoresist layer 314b is used to re-define the pattern of patterned hard mask layer 402.

Figure 5F:
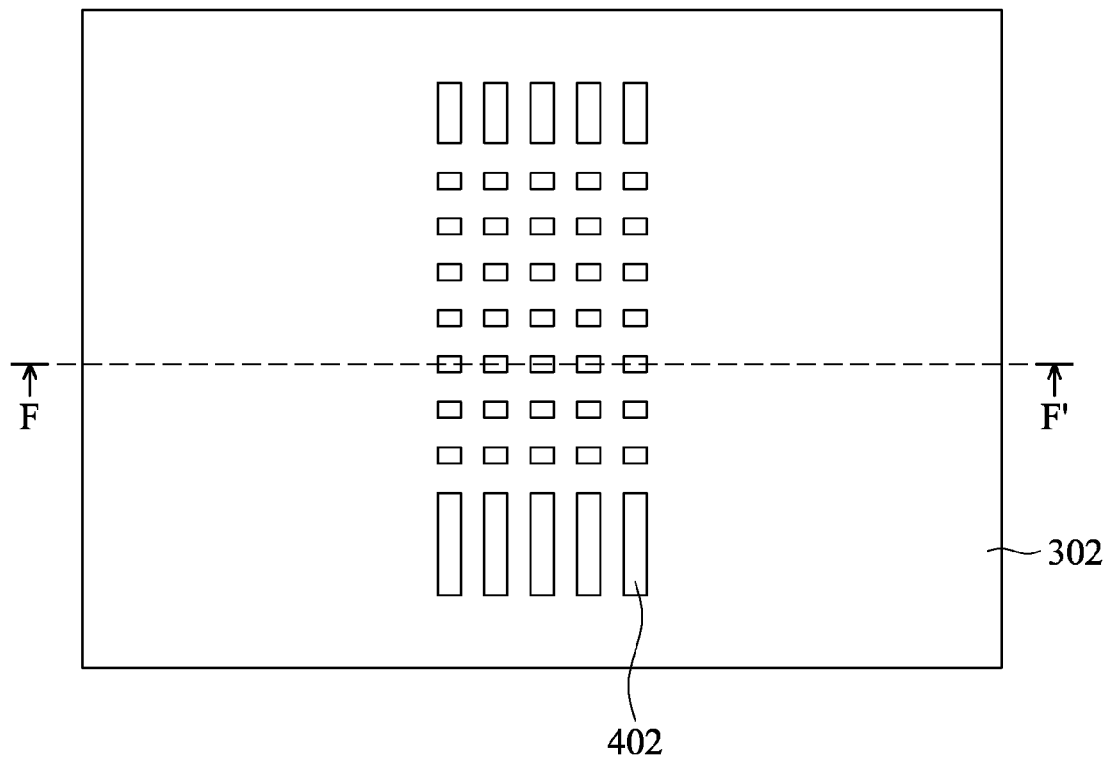
Figure 5F:
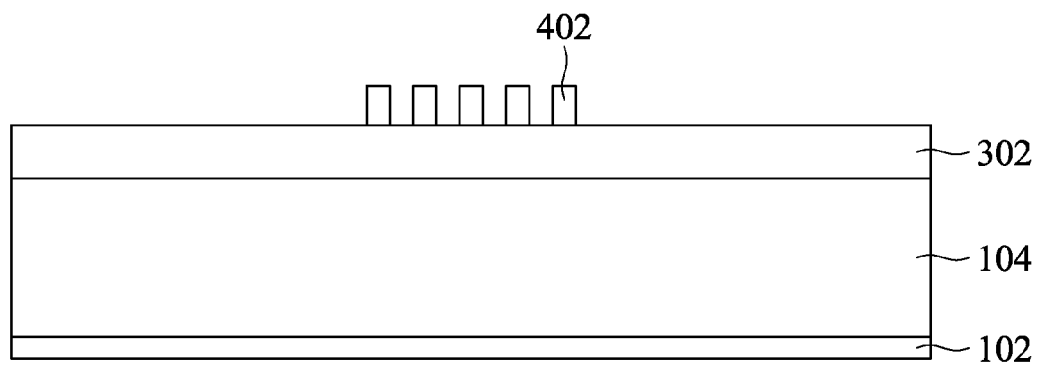

Afterwards, the pattern of patterned photoresist layers 314b is transferred to hard mask layer 402 as shown in FIG. 5F, in accordance with some embodiments of the disclosure. Therefore, patterned hard mask layer 402 has a grid-like pattern.

FIG. 5F' is a cross-sectional representation taken along line FF' of FIG. 5F. A portion of patterned hard mask layer 402 is formed on polysilicon layer 302. Afterwards, the structure depicted in FIG. 5F may continue with the steps of FIGS. 4E-4F to form other structures or devices.

Figure 6A:
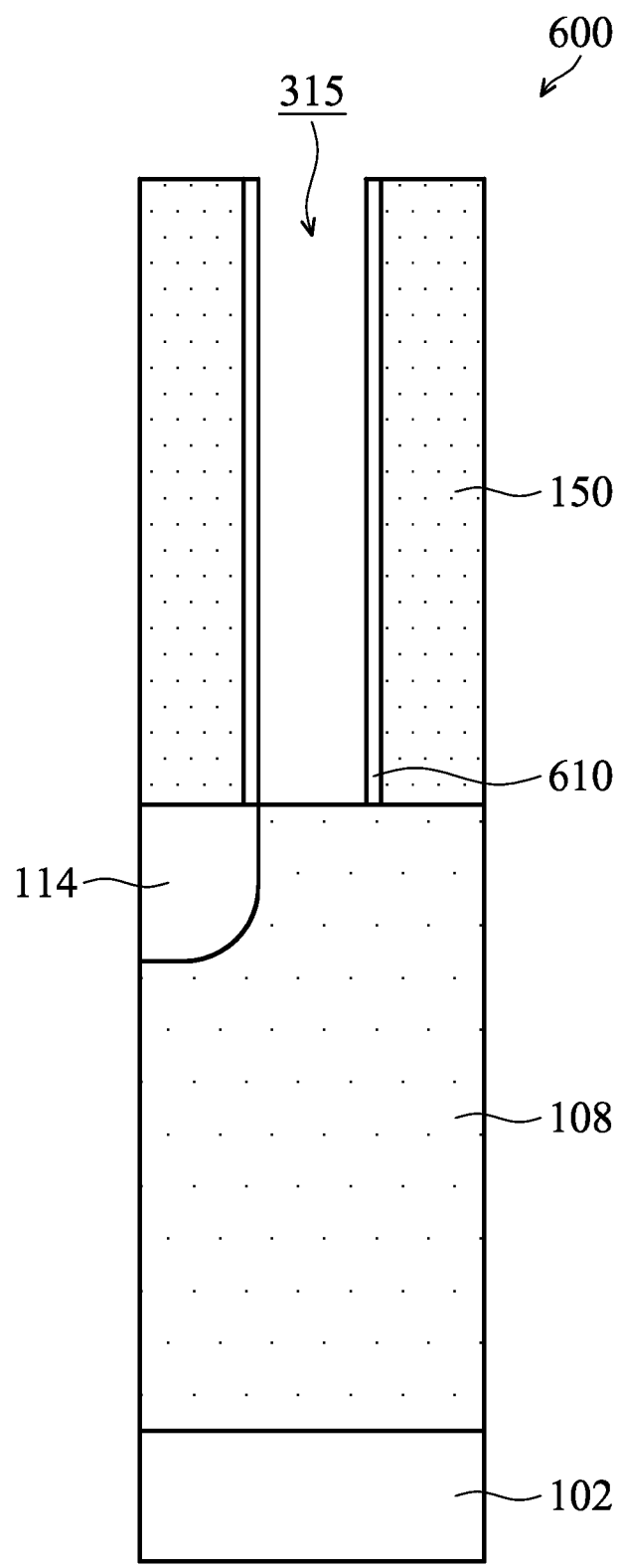
FIGS. 6A-6E show cross-sectional representations of various stages of forming a capping layer on a gate electrode, in accordance with some embodiments of the disclosure.

FIGS. 6A-6E show cross-sectional representations of various stages of forming a capping layer on a gate electrode, in accordance with some embodiments of the disclosure. FIG. 6A is an enlarged representation of region 600 in FIG. 3E''.

Referring to FIG. 6A, a pair of spacers 610 are formed on opposite sides of trench 315.

Figure 6B:
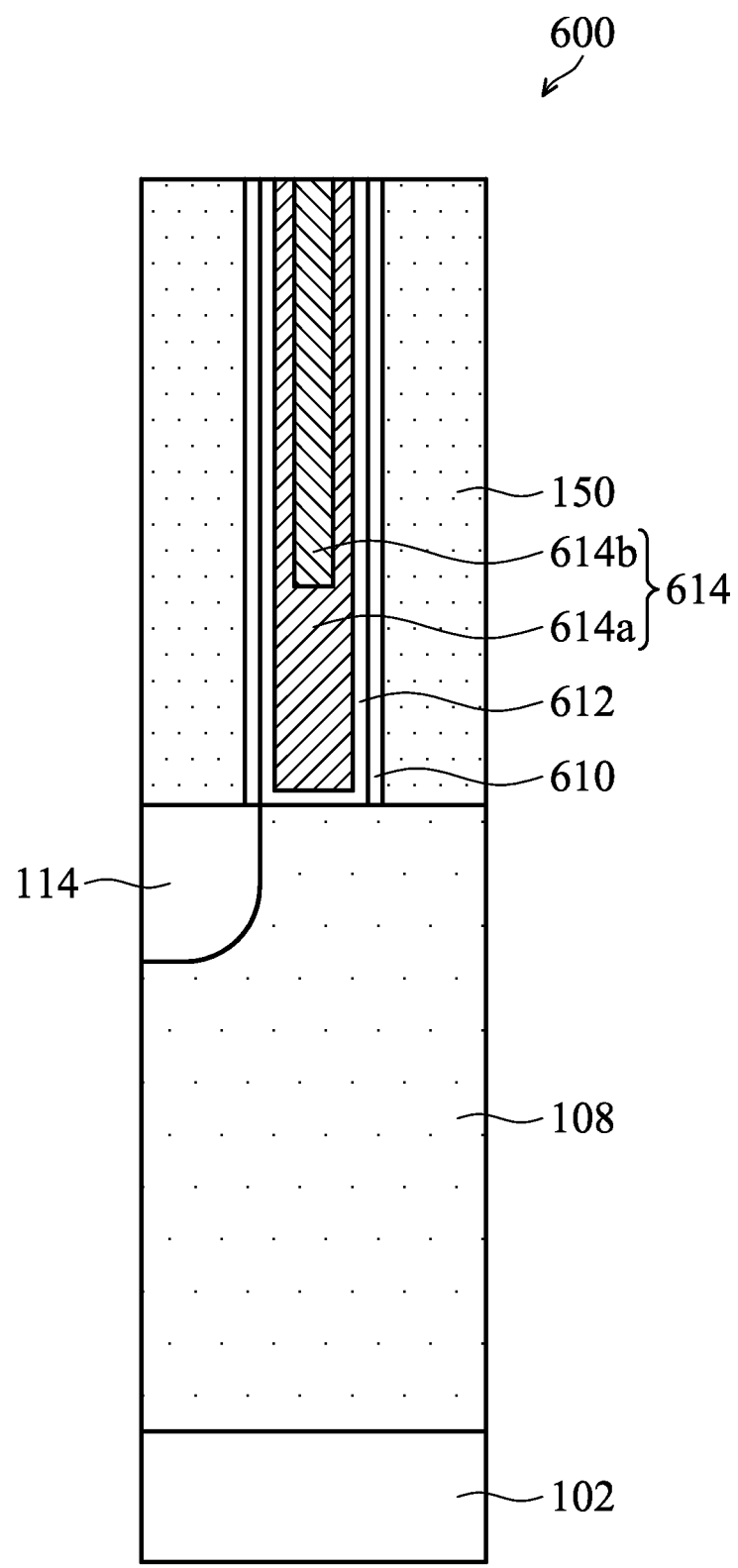

Afterwards, a gate dielectric layer 612 is formed in trench 315, and then a first gate electrode 614a and a second gate electrode 614b are formed on gate dielectric layer 612, as shown in FIG. 6B, in accordance with some embodiments of the disclosure. First gate electrode 614a and second gate electrode 614b have different etching properties.

Figure 6C:
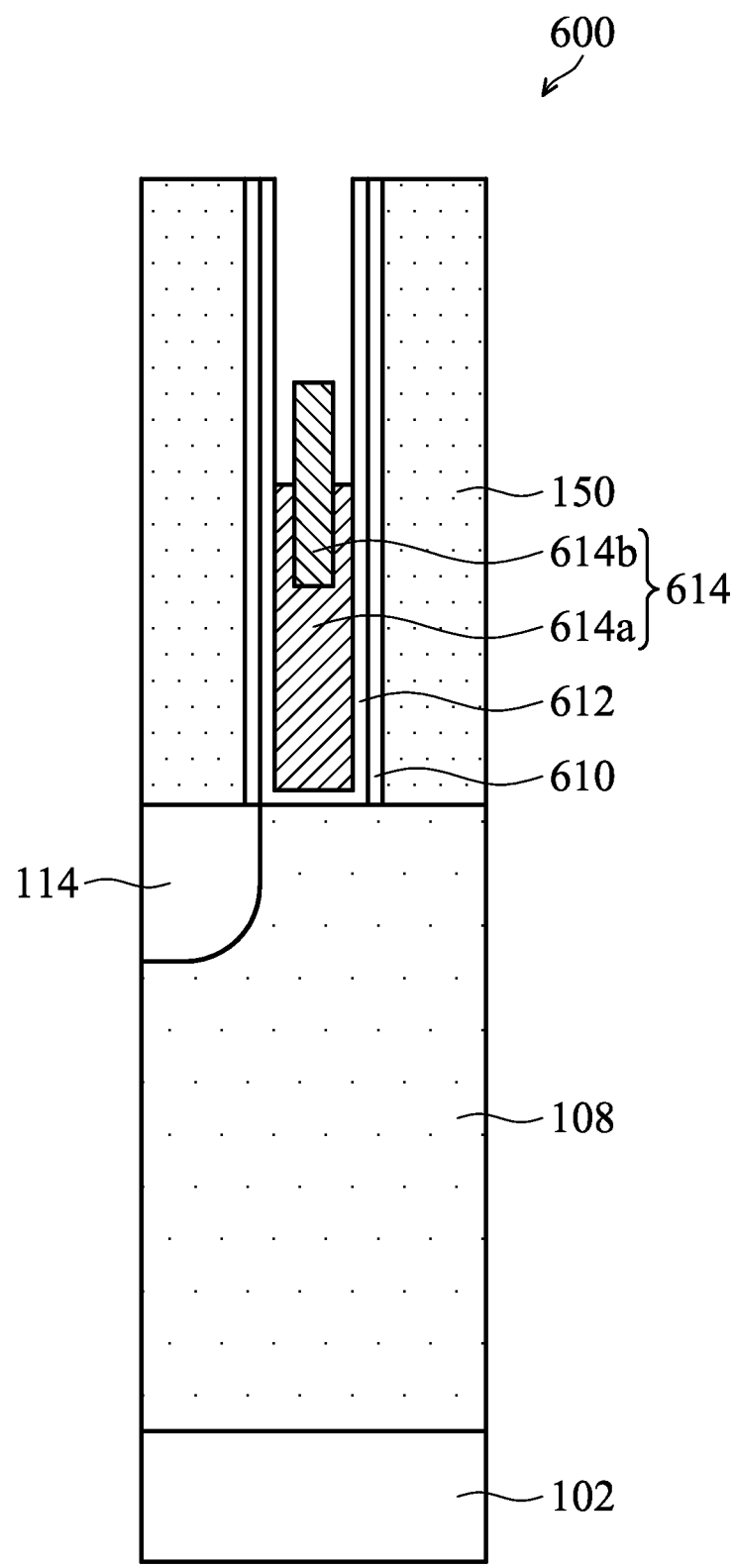

After first gate electrode 614a and a second gate electrode 614b are formed on gate dielectric layer 612, a portion of first gate electrode 614a and apportion of second gate electrode 614b are removed as shown in FIG. 6C, in accordance with some embodiments of the disclosure.

In some embodiments, an etching process is used to etch first gate electrode 614a a faster rate than second gate electrode 614b. More specifically, the etching chemistry is more selective to second gate electrode 614b. In some other embodiments, two etching processes are used, one is for first gate electrode 614a and another is for second gate electrode 614b. If two etching processes are used, a larger portion of first gate electrode 614a should be removed relative to second gate electrode 614b. In some embodiments, the etching process includes a wet etching or a dry etching.

It should be noted that gate electrode 614 has a relatively larger height in middle portion than in outer portion. Therefore, a stepped profile of gate electrode 614 is provided.

Figure 6D:
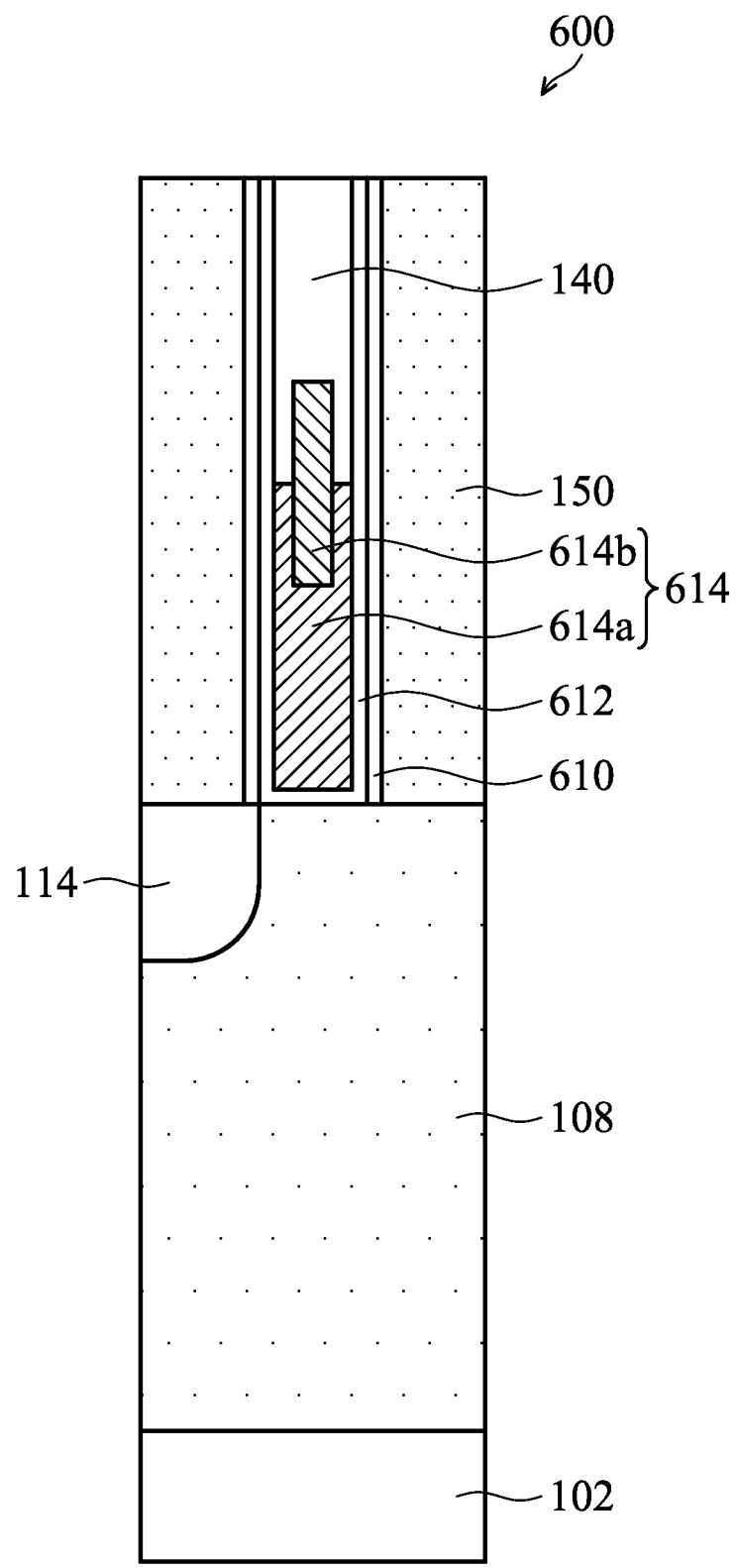

After the portions of first gate electrode 614a and second gate electrode 614b are removed, capping layer 140 is formed on first gate electrode 614a and second gate electrode 614b as shown in FIG. 6D, in accordance with some embodiments of the disclosure. It should be noted that capping layer 140 has a thick outer portions and thin middle portions due to the stepped profile of gate electrode 614.

Figure 6E:
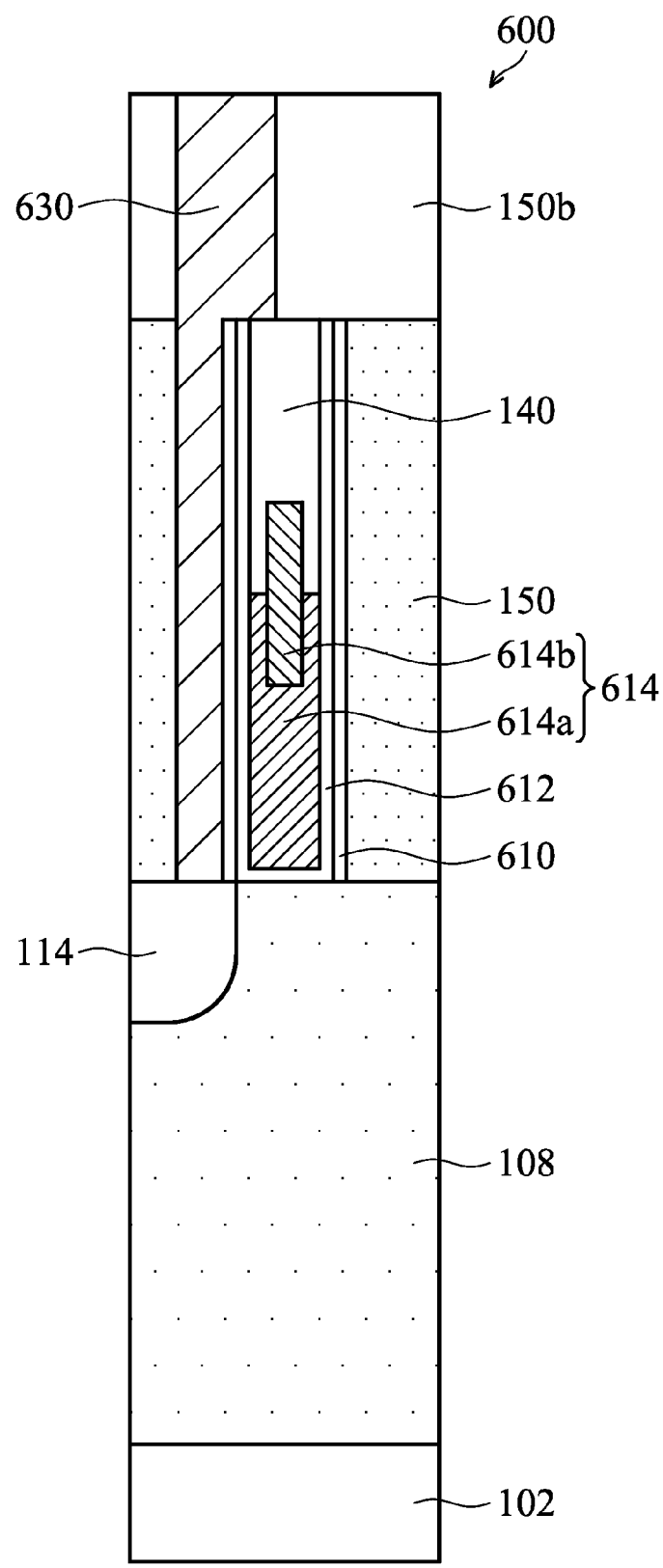

After capping layer 140 is formed, a second ILD structure 150b is formed on ILD structure 150, and an etching process is performed to remove a portion of second ILD structure 150b and ILD structure 150 to form recess (not shown), and conductive material is filled into the recess to form contact structure 630 as shown in FIG. 6E. The stepped profile of capping layer 140 provides an effective electrical isolation between gate electrode 614 and contact structure 630.

Figure 7A:
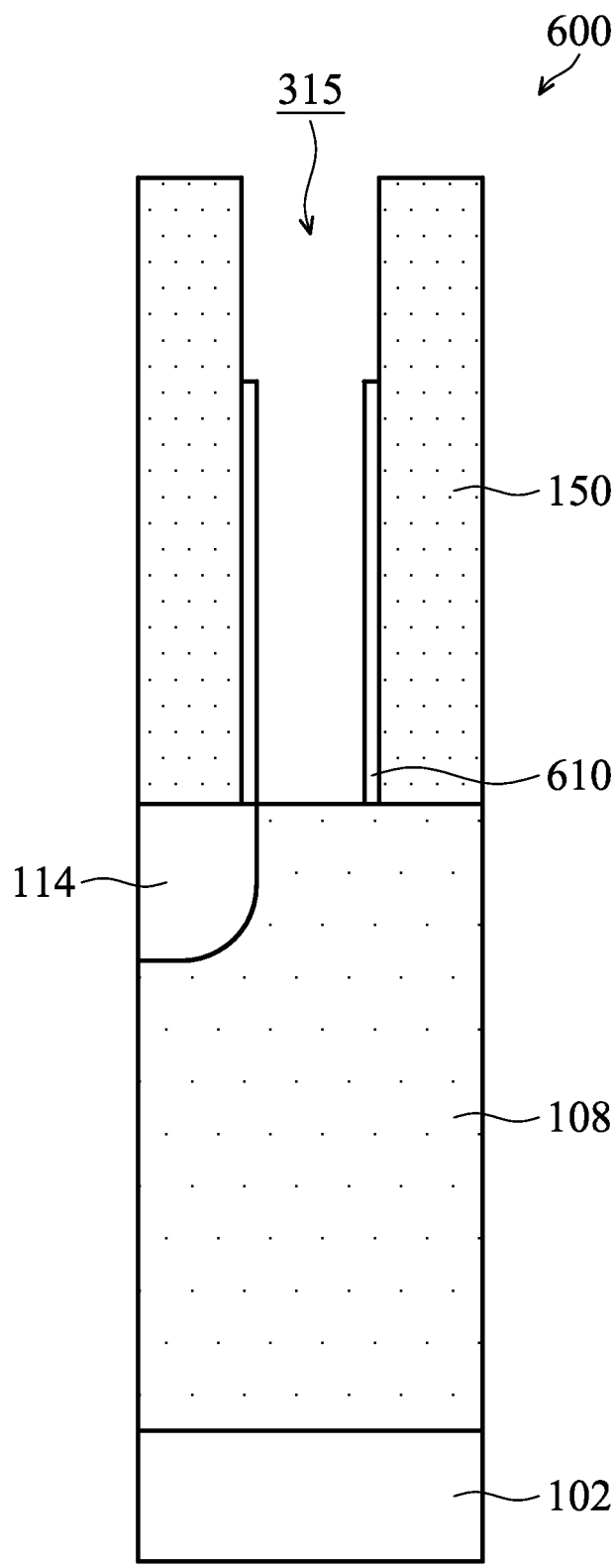
FIGS. 7A-7D show cross-sectional representations of various stages of forming a capping layer on a gate electrode, in accordance with some embodiments of the disclosure.

FIGS. 7A-7D show cross-sectional representations of various stages of forming a capping layer on a gate electrode, in accordance with some embodiments of the disclosure. FIG. 7A is an enlarged representation of region 600 in FIG. 3E".

Referring to FIG. 7A, a pair of spacers 610 are formed on opposite sides of trench 315. Compared with FIG. 7A, the upper portion of spacers 610 is removed in FIG. 7B.

Figure 7B:
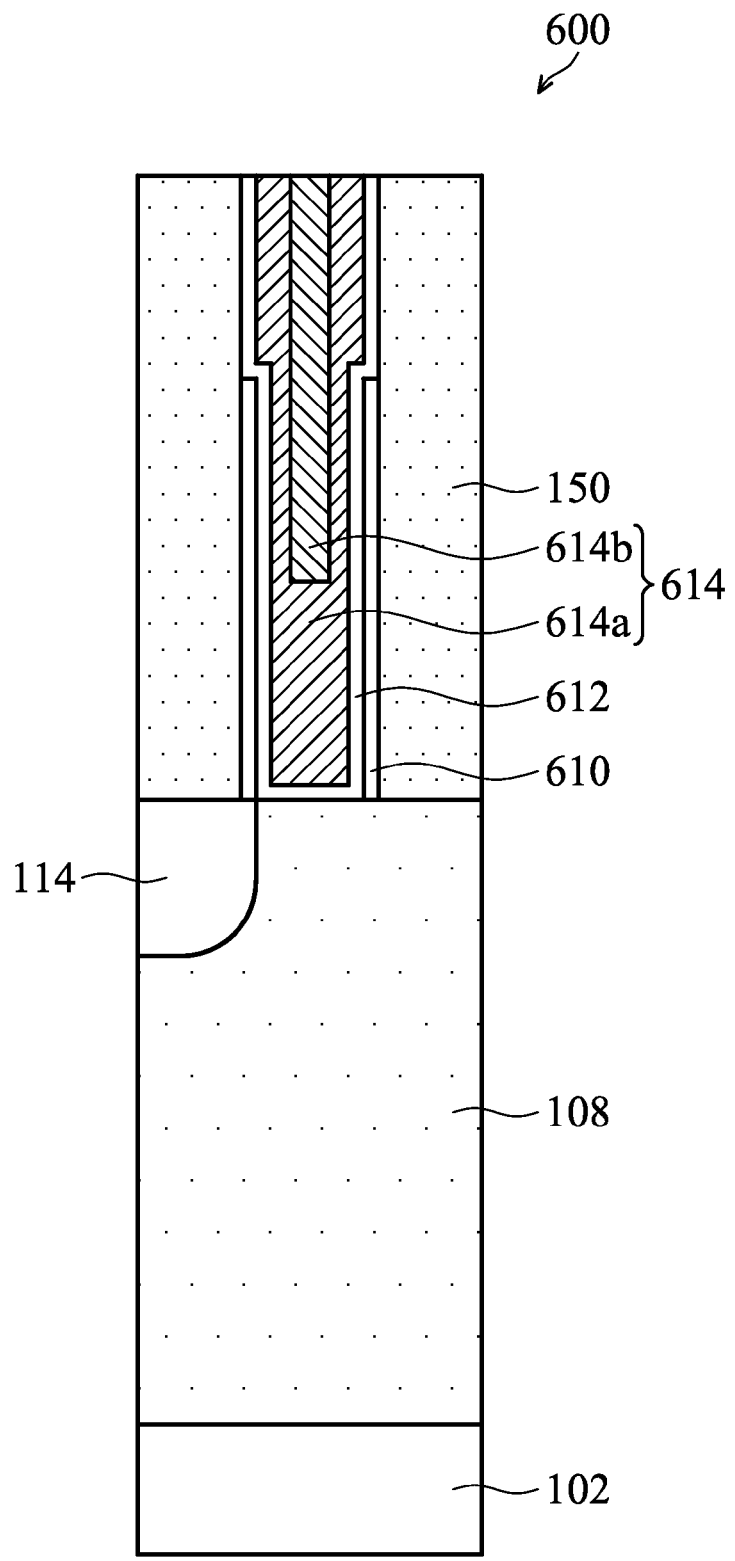

Afterwards, gate dielectric layer 612 is formed in trench 315, and then first gate electrode 614a and second gate electrode 614b are formed on gate dielectric layer 612, as shown in FIG. 7B, in accordance with some embodiments of the disclosure. First gate electrode 614a and second gate electrode 614b have different etching properties.

Figure 7C:
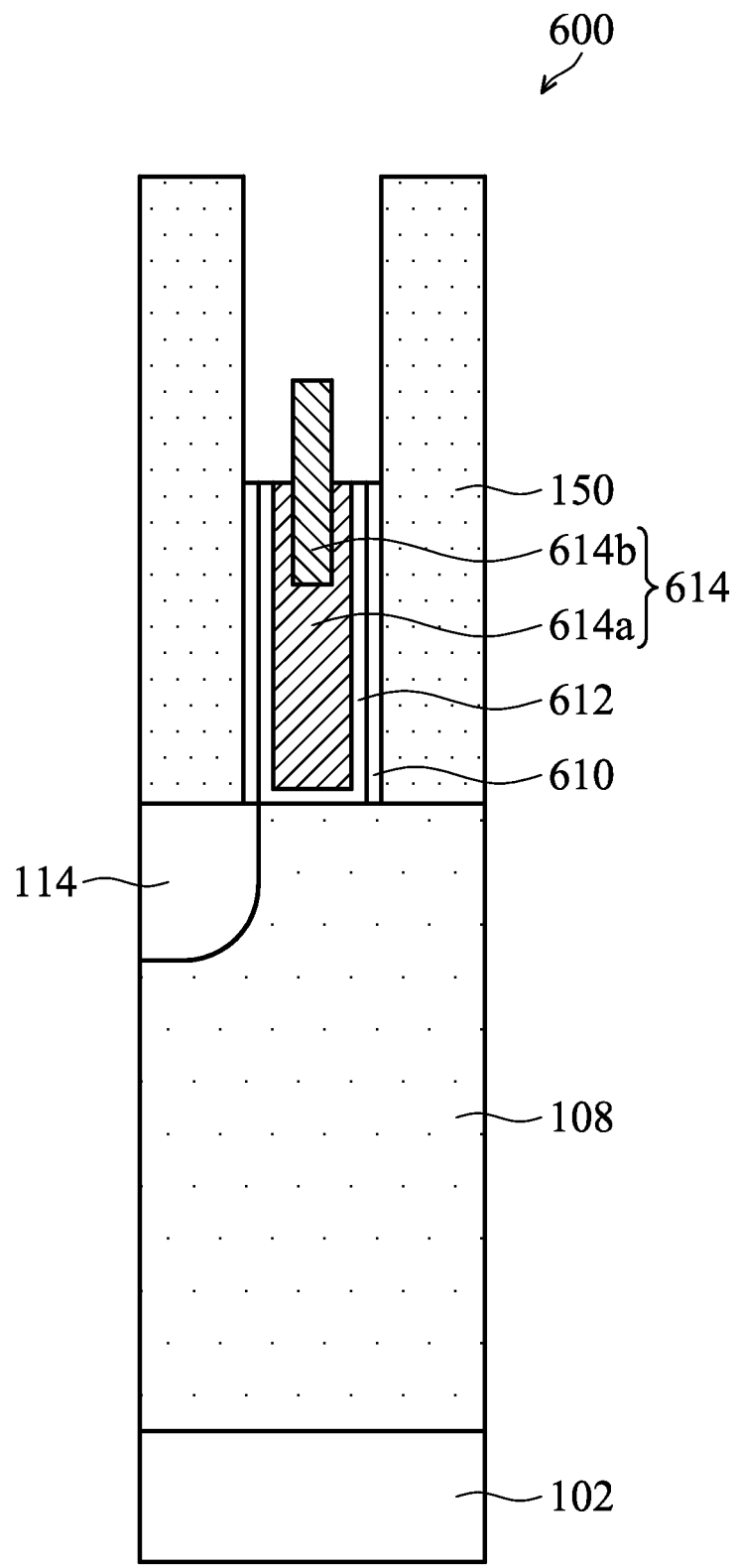

After first gate electrode 614a and second gate electrode 614b are formed on gate dielectric layer 612, a portion of first gate electrode 614a and second gate electrode 614b are removed as shown in FIG. 7C, in accordance with some embodiments of the disclosure. Compared with FIG. 6C, upper portion of gate dielectric layer 612 is removed in FIG. 7C.

Figure 7D:
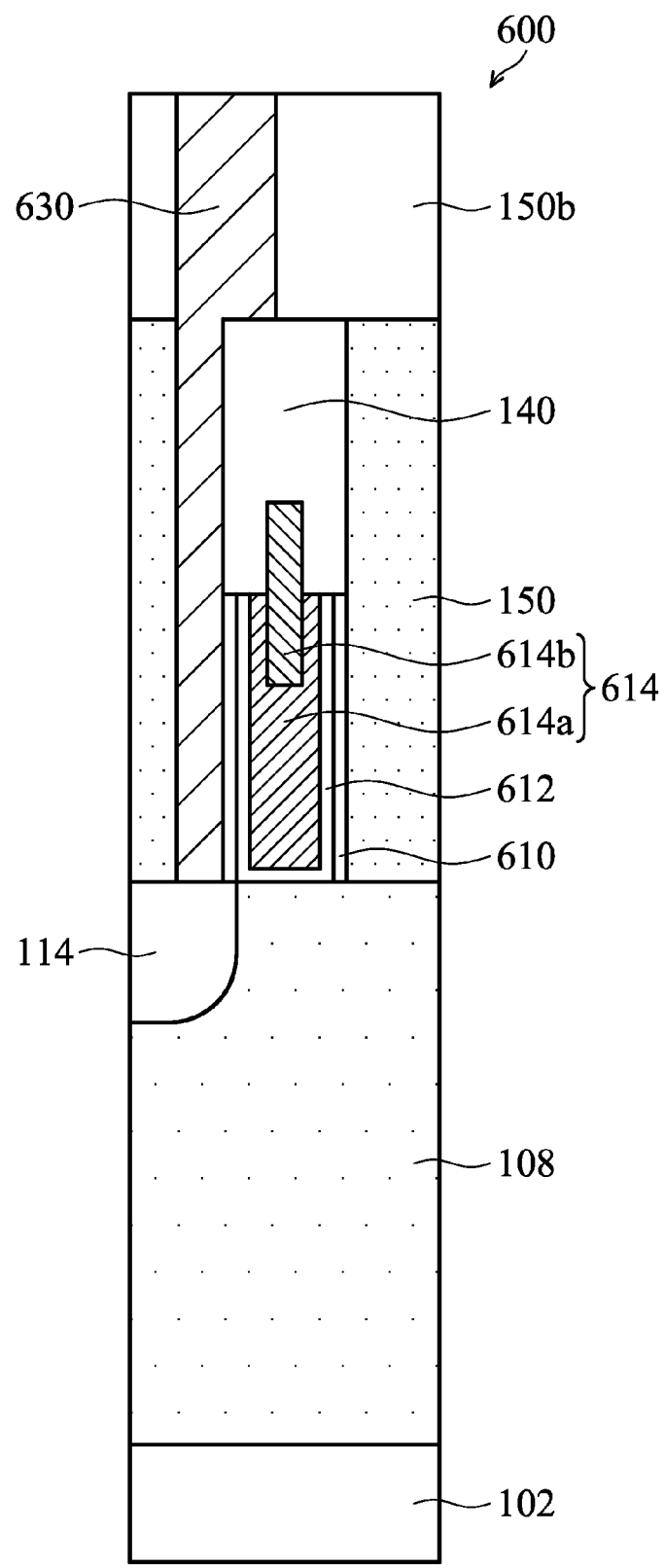

After the portions of first gate electrode 614a and second gate electrode 614b are removed, capping layer 140 is formed on first gate electrode 614a and second gate electrode 614b as shown in FIG. 7D, in accordance with some embodiments of the disclosure.

Afterwards, a second ILD structure 150b is formed on ILD structure 150, and an etching process is performed to remove a portion of second ILD structure 150b and ILD structure 150 to form recess (not shown), and conductive material is filled into the recess to form contact structure 630. It should be noted that capping layer 140 extends over spacers 610, therefore spacers 610 are protected during the etching process for forming contact structure 630.

Embodiments for forming fin field effect transistor (FinFET) device structure are provided. A gate electrode of FinFET device structure has a grid-like pattern when seen from a top-view. The gate electrode is formed over the fin structures. The gate electrode has a number of first portions and second portions, and the first portions are parallel to the fin structures. ILD structure is formed in areas enclosed by the first portions and the second portions of the gate electrode. The grid-like pattern of the gate electrode has a smaller area than a gate electrode with a rectangular pattern. A number of dummy gate electrodes are formed adjacent to the gate electrode. Therefore, the loading effect is reduced.

In some embodiments, a fin field effect transistor (FinFET) device structure is provided. The FinFET structure includes a substrate and a fin structure extending above the substrate. The FinFET structure also includes a gate electrode formed over the fin structure, and the gate electrode has a grid-like pattern when seen from a top-view.

In some embodiments, a fin field effect transistor (FinFET) device structure is provided. The FinFET structure includes a substrate and an isolation structure formed on the substrate. The FinFET structure also includes a plurality of fin structures extending above the substrate, and an upper portion of the fin structure protrudes from the isolation structure. The FinFET structure further includes a gate electrode formed over the fin structures. The gate electrode has a plurality of first portions and a plurality of second portions, and the first portions are parallel to the fin structures. The FinFET structure also includes an inter-layer dielectric (ILD) structure formed on the fin structures, and a portion of the ILD structure is directly formed on the isolation structure and between two adjacent first portions of the gate electrode.

In some embodiments, a method for forming a fin field effect transistor (FinFET) device structure is provided. The method includes providing a substrate and forming a fin structure above the substrate. The method also includes forming a temporal gate electrode over the fin structure. The temporal gate electrode has a plurality of first portions and a plurality of second portions, and the first portions are perpendicular to second portions to form recesses. The method further includes forming an inter-layer dielectric (ILD) structure in the recesses. The method also includes removing the temporal gate electrode to form a plurality of trenches and forming a gate electrode in the trenches. The method includes removing a portion of the gate electrode; and forming a hard mask layer on the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a substrate;
   a fin structure extending above the substrate; and
   a gate electrode formed over the fin structure, wherein the gate electrode has a plurality of first portions and a plurality of second portions, and wherein the first portions are perpendicular to the second portions.

2. The fin field effect transistor (FinFET) device structure as claimed in claim 1, wherein a plurality of regions are formed by the first portion and the second portion, and the regions are in the shape of a circle, rectangle, ellipse, square, or polygon when seen from a top view.

3. The fin field effect transistor (FinFET) device structure as claimed in claim 1, further comprising:
   an inter-layer dielectric (ILD) structure formed between the first portion and the second portion.

4. The fin field effect transistor (FinFET) device structure as claimed in claim 1, further comprising:
   a plurality of dummy gate electrodes formed adjacent to the gate electrode.

5. The fin field effect transistor (FinFET) device structure as claimed in claim 1, wherein the gate electrode has a length in a range from about 36 nm to about 360 nm.

6. The fin field effect transistor (FinFET) device structure as claimed in claim 5, further comprising:
   a source region and a drain region formed in the fin structure on opposite sides of the gate electrode, wherein a channel region is interposed between the source region and the drain region, and the channel region has a channel length equal to the length of the gate electrode.

7. The fin field effect transistor (FinFET) device structure as claimed in claim 1, further comprising:
   a high-k dielectric layer formed underlying the gate electrode; and
   a hard mask layer formed on the gate electrode.

8. The fin field effect transistor (FinFET) device structure as claimed in claim 1, further comprising:
   an isolation structure formed on the substrate, wherein a portion of the fin structure is embedded in the isolation structure.

9. A fin field effect transistor (FinFET) device structure, comprising:
   a substrate;
   an isolation structure formed on the substrate;
   a plurality of fin structures extending above the substrate, wherein an upper portion of the fin structure protrudes from the isolation structure;
   a gate electrode formed over the fin structures, wherein the gate electrode has a plurality of first portions and a plurality of second portions, and the first portions are parallel to the fin structures; and
   an inter-layer dielectric (ILD) structure formed on the fin structures, wherein a portion of the ILD structure is directly formed on the isolation structure and between two adjacent first portions of the gate electrode.

10. The fin field effect transistor (FinFET) device structure as claimed in claim 9, wherein the second portions of the gate electrode traverse over the fin structures.

11. The fin field effect transistor (FinFET) device structure as claimed in claim 9, wherein the gate electrode has a grid pattern when seen from a top-view.

12. The fin field effect transistor (FinFET) device structure as claimed in claim 9, further comprising:
    a source region and a drain region formed in the fin structure on opposite sides of the gate electrode, wherein a channel region is interposed between the source region and the drain region, and the channel region has a channel length equal to a length of the gate electrode.

13. The fin field effect transistor (FinFET) device structure as claimed in claim 12, wherein the channel length is in a range from about 36 nm to about 360 nm.

14. The fin field effect transistor (FinFET) device structure as claimed in claim 9, further comprising:
    a plurality of dummy gate electrodes formed adjacent to the gate electrode.

15. The fin field effect transistor (FinFET) device structure as claimed in claim 14, wherein a pitch between second portions of the gate electrode is equal to a pitch between two adjacent dummy gate electrodes.

16. The fin field effect transistor (FinFET) device structure as claimed in claim 1, further comprising:
    a cap layer formed on the gate electrode.

17. The fin field effect transistor (FinFET) device structure as claimed in claim 1, wherein the gate electrode comprises a first material and a second material, wherein the first material and the second material have different etching properties.

18. The fin field effect transistor (FinFET) device structure as claimed in claim 1, wherein the first portions are parallel to the fin structure.

19. The fin field effect transistor (FinFET) device structure as claimed in claim 1, further comprising:
    a plurality of dummy gate electrodes formed adjacent to the gate electrode, wherein a pitch between second portions of is equal to a pitch between two adjacent dummy gate electrodes.

* * * * *